United States Patent
Kim et al.

(10) Patent No.: US 11,531,385 B2
(45) Date of Patent: Dec. 20, 2022

(54) VOLTAGE DROOP MONITORING CIRCUITS, SYSTEM-ON CHIPS AND METHODS OF OPERATING THE SYSTEM-ON CHIPS

(71) Applicant: Samsung Electronics Co., Ltd., Suwon-si (KR)

(72) Inventors: Yong-Hwan Kim, Seoul (KR); Wook Kim, Yongin-si (KR); In-Sub Shin, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 500 days.

(21) Appl. No.: 16/519,621

(22) Filed: Jul. 23, 2019

(65) Prior Publication Data
US 2020/0089299 A1    Mar. 19, 2020

(30) Foreign Application Priority Data

Sep. 17, 2018 (KR) .................. 10-2018-0110784
Feb. 7, 2019 (KR) .................. 10-2019-0014363

(51) Int. Cl.
*G06F 1/28* (2006.01)
*G06F 1/32* (2019.01)
(Continued)

(52) U.S. Cl.
CPC .................. *G06F 1/28* (2013.01); *G06F 1/32* (2013.01); *H03K 3/037* (2013.01); *H03K 3/0315* (2013.01);
(Continued)

(58) Field of Classification Search
CPC ........... G06F 1/28; G06F 1/32; H03K 3/0315; H03K 3/037; H03L 7/0802; H03L 7/097
See application file for complete search history.

(56) References Cited

U.S. PATENT DOCUMENTS 7,480,810 B2   1/2009   Gonzalez et al.
7,495,519 B2   2/2009   Kim et al.
(Continued)

FOREIGN PATENT DOCUMENTS

JP    20140052969 A    3/2014

OTHER PUBLICATIONS

Michael S. Floyd et al., "Adaptive Clocking in the POWER9 Processor for Voltage Droop Protection", 2017, pp. 444-445.
(Continued)

*Primary Examiner* — Phil K Nguyen
*Assistant Examiner* — Gayathri Sampath
(74) *Attorney, Agent, or Firm* — Harness, Dickey & Pierce, PL.C

(57) ABSTRACT

In one embodiment, the voltage droop monitoring circuit includes a ring oscillator circuit block configured to generate a plurality of oscillation signals and configured to output a selected oscillation signal from one of the plurality of oscillation signals based on a first control signal. The first control signal is based on a power supply voltage of a functional circuit block. The voltage droop monitoring circuit further includes a counter configured to generate a count value based on the selected oscillation signal, and a droop detector configured detect droop in the power supply voltage of the functional circuit block based on the count value and at least one threshold value.

17 Claims, 19 Drawing Sheets

(51) Int. Cl.
| | |
|---|---|
| *H03K 3/03* | (2006.01) |
| *H03K 3/037* | (2006.01) |
| *H03L 7/08* | (2006.01) |
| *H03L 7/097* | (2006.01) |
| *H03L 7/099* | (2006.01) |
| *G06F 1/3296* | (2019.01) |
| *G06F 1/08* | (2006.01) |
| *G01R 9/00* | (2006.01) |
| *G06F 15/78* | (2006.01) |

(52) U.S. Cl.
CPC ............ *H03L 7/0802* (2013.01); *H03L 7/097* (2013.01); *H03L 7/0997* (2013.01)

(56) References Cited

U.S. PATENT DOCUMENTS

| | | | |
|---|---|---|---|
| 7,567,135 | B2 | 7/2009 | Rogers et al. |
| 7,746,143 | B2 | 6/2010 | Endo |
| 8,390,313 | B2 | 3/2013 | Ikenaga et al. |
| 8,892,922 | B2 | 11/2014 | Frank |
| 9,312,862 | B2 | 4/2016 | Penzes et al. |
| 9,819,258 | B1* | 11/2017 | Vandam ............ G01R 31/31816 |
| 9,825,620 | B2 | 11/2017 | Zogopoulos et al. |
| 2006/0020838 | A1* | 1/2006 | Tschanz ................. G06F 1/206 713/322 |
| 2011/0187419 | A1 | 8/2011 | Ikenaga et al. |
| 2014/0032139 | A1* | 1/2014 | Priel ......................... G06F 1/28 702/61 |
| 2015/0180482 | A1 | 6/2015 | Bourstein et al. |
| 2017/0052586 | A1* | 2/2017 | Nejedlo ................... G06F 1/28 |
| 2017/0300080 | A1* | 10/2017 | Jain ......................... G06F 1/305 |
| 2018/0095115 | A1 | 4/2018 | Fukuoka et al. |
| 2018/0248555 | A1* | 8/2018 | Jenkins ............... G01R 31/2851 |
| 2019/0265767 | A1* | 8/2019 | Mehra ................... G06F 1/3206 |
| 2019/0317546 | A1* | 10/2019 | Born ......................... G06F 1/08 |
| 2020/0028514 | A1* | 1/2020 | Hanke ....................... G06F 1/10 |

OTHER PUBLICATIONS

Aaron Grenat et al., "Adaptive Clocking System for Improved Power Efficiency in a 28nm x86-64 Microprocessor", 2014, pp. 106-108.

* cited by examiner

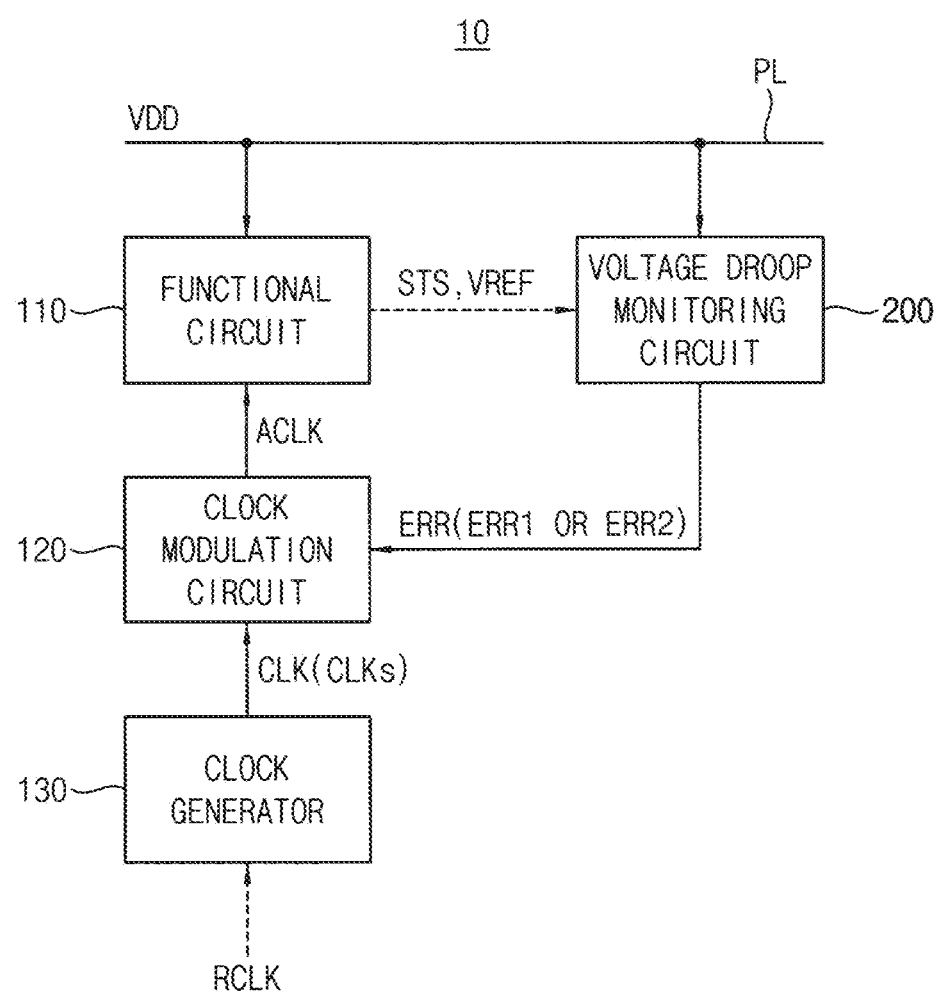

FIG. 6
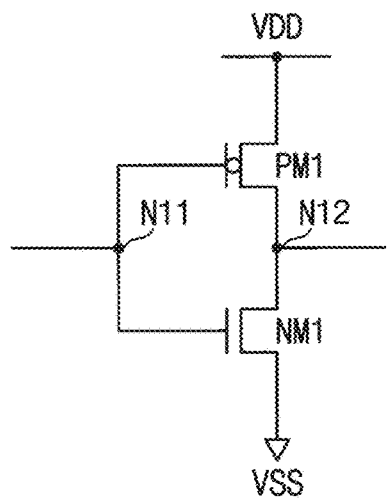
FIG. 7A
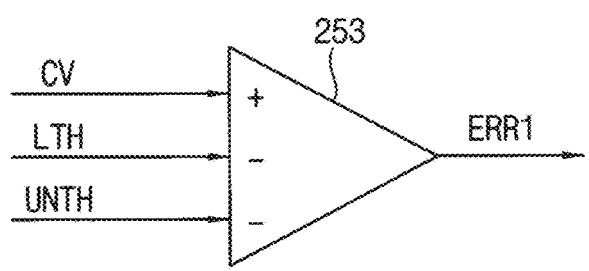
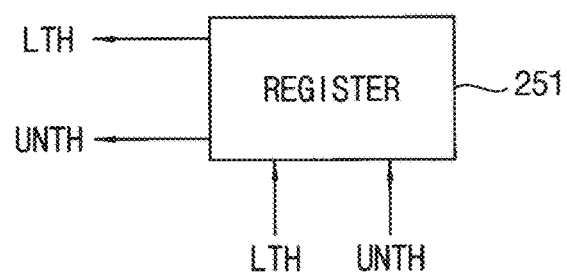

VOLTAGE DROOP MONITORING CIRCUITS, SYSTEM-ON CHIPS AND METHODS OF OPERATING THE SYSTEM-ON CHIPS

CROSS-REFERENCE TO RELATED APPLICATIONS

This application claims the benefit of priority under 35 USC § 119 to Korean Patent Application No. 10-2018-0110784, filed on Sep. 17, 2018 and to Korean Patent Application No. 10-2019-0014363, filed on Feb. 7, 2019, in the Korean Intellectual Property Office, the disclosures of each of which are incorporated by reference in their entirety herein.

BACKGROUND

The present disclosure relates to semiconductor circuits, and more particularly to voltage droop monitoring circuits, system-on chips including the same and/or methods of operating system-on chips.

In a semiconductor circuit, particularly a high-performance semiconductor circuit, a supplied voltage may swing depending on an operation environment and the level of a performed operation within the circuit. Generally, a voltage supplied to support the worst case when a voltage decreases significantly is set to be greater than a value required for the case of a normal state. However, because this conventional method causes power consumption of a semiconductor circuit to increase, competitiveness of products is weakened.

To overcome the above disadvantage, when a supplied voltage of a circuit starts decreasing, the decrease of the supplied voltage is detected. Operating speed or work level of the circuit is changed based on a result of the detection to allow a normal operation to be performed even when a voltage decreases. For achieving this, it is important to rapidly and accurately know a voltage state of the circuit. A manner of monitoring a voltage of a semiconductor circuit is classified into a digital manner and an analog manner.

SUMMARY

At least one embodiment relates to voltage droop monitoring circuit.

In one embodiment, the voltage droop monitoring circuit includes a ring oscillator circuit block configured to generate a plurality of oscillation signals and configured to output a selected oscillation signal from one of the plurality of oscillation signals based on a first control signal. The first control signal is based on a power supply voltage of a functional circuit block. The voltage droop monitoring circuit further includes a counter configured to generate a count value based on the selected oscillation signal, and a droop detector configured detect droop in the power supply voltage of the functional circuit block based on the count value and at least one threshold value.

In another embodiment, the voltage droop monitoring circuit includes a ring oscillator circuit block configured to generate a plurality of oscillation signals and configured to output a selected oscillation signal from one of the plurality of oscillation signals; a counter configured to generate a count value based on the selected oscillation signal; and a droop detector configured detect droop in a power supply voltage of the functional circuit block based on the count value and at least first and second threshold values. The second threshold value is greater than the first threshold value. The droop detector is configured to detect droop in the power supply voltage in response to the count value falling below a first threshold value; and the droop detector is configured to detect an end of droop in the power supply voltage in response to the count value exceeding the second threshold value.

In one embodiment, the voltage droop monitoring circuit includes a ring oscillator circuit block configured to generate a plurality of oscillation signals and configured to output a selected oscillation signal from one of the plurality of oscillation signals; a counter configured to generate a count value based on the selected oscillation signal; and a droop detector configured detect droop in a power supply voltage of the functional circuit block based on the count value and at least first and second threshold values such that greater level of droop is detected in response to the count value falling below the first threshold value than the second threshold value. The second threshold value is greater than the first threshold value.

At least one embodiment relates to a system-on chip.

In one embodiment, the system-on chip includes a voltage droop monitoring circuit configured to monitor droop in a power supply voltage of a functional circuit block, and generate an error signal based on the monitoring; and a clock modulation circuit configured to modulate an input clock signal based on the error signal to generate an adaptive clock signal, and configured to output the adaptive clock signal to the functional circuit block.

A least one embodiment relates to a method of monitoring voltage droop.

In one embodiment, the method includes selecting an oscillation signal from one of a plurality of oscillation signals based on a power supply voltage of a functional circuit block; generating a count value based on the selected oscillation signal; and detecting droop in a power supply voltage of the functional circuit block based on the count value and at least one threshold value.

At least one embodiment relates to another method.

In one embodiment, the method includes generating an error signal based on monitoring droop in a power supply voltage of a functional circuit block; modulating an input clock signal based on the error signal to generate an adaptive clock signal; and outputting the adaptive clock signal to the functional circuit block.

BRIEF DESCRIPTION OF THE DRAWINGS

Example embodiments will be described below in more detail with reference to the accompanying drawings.

FIG. 1 is a circuit block diagram illustrating a system-on chip (SoC) according to some example embodiments.

FIG. 6 illustrates one of the delay cells in FIG. 5A or FIG. 5B.

FIG. 7A is a circuit block diagram illustrating an example of the droop detector in FIG. 2A according to some example embodiments.

DETAILED DESCRIPTION

Figure 2A:
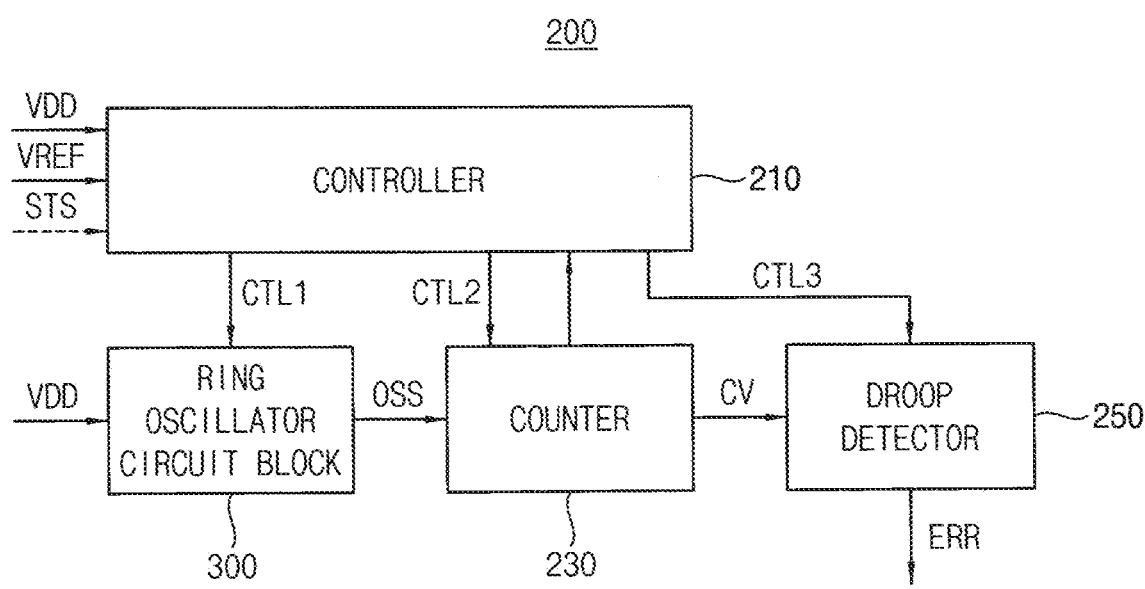
FIG. 2A is a circuit block diagram illustrating an example of the voltage droop monitoring circuit in FIG. 1 according to some example embodiments.

Various example embodiments will be described more fully hereinafter with reference to the accompanying drawings, in which example embodiments are shown.

FIG. 1 is a circuit block diagram illustrating a system-on chip (SoC) according to example embodiments.

The SoC 10 of FIG. 1 may be also referred to as an adaptive clock system.

Referring to FIG. 1, the SoC 10 includes a functional circuit 110, a clock modulation circuit 120, a clock generator 130 and a voltage droop monitoring circuit 200.

The functional circuit 110 may operate by receiving a power supply voltage VDD through a power line PL and may perform a plurality of functions.

The voltage droop monitoring circuit 200 may receive the power supply voltage VDD through the power line PL, may monitor a level of the power supply voltage VDD and may provide the clock modulation circuit 120 with an error signal ERR if a droop occurs in the power supply voltage VDD. The error signal ERR may be a first error signal ERR1 including a single bit or a second error signal ERR2 including a plurality of bits.

The clock generator 130 may be implemented with a phase-locked loop (PLL), and may generate at least one clock signal CLK(s) based on a reference clock RCLK may provide the clock signal CLK to the clock modulation circuit 120. The clock generator 130 may provide a plurality of clock signals CLKs to the clock modulation circuit 120.

The clock modulation circuit 120 may receive the error signal ERR and the clock signal CLK, may generate a corresponding adaptive clock signal ACLK by modulating the clock signal CLK and provide the adaptive clock signal ACLK to the functional circuit 110.

The clock modulation circuit 120 may adjust a frequency of the clock signal CLK by dividing the clock signal CLK or multiplexing the clock signal CLK in response to the error signal to output the adaptive clock signal ACLK. The clock modulation circuit 120 may include a plurality of frequency dividers and a multiplexer. Each of the frequency dividers may divide a frequency of the clock signal CLK and the multiplexer may output at least one of the outputs of the frequency dividers as the adaptive clock signal ACLK. In example embodiments, the clock modulation circuit 120 may include a plurality of multipliers and the multipliers may multiply the clock signal CLK with a ratio (e.g., 90% or 80%). In this case, the multiplexer may output one of the outputs of the frequency dividers or one of the outputs of the multipliers as the adaptive clock signal ACLK.

In example embodiments, the functional circuit 110 may provide the voltage droop monitoring circuit 200 with a status signal STS indicating operating status (e.g., temperature, operating voltage, change in operating voltage, etc.) and operating speed of the functional circuit 110. The functional circuit 110, or other circuitry external or internal to the voltage drop monitoring circuit 200, may supply a reference voltage VREF. The reference voltage VREF may be generated according to any dynamic voltage frequency scale (DVFS) technique, which may also affect the operating voltage level VDD scheme.

The SoC 10 of FIG. 1 may detect that droop occurs in the power supply voltage VDD and may adjust a frequency of the clock signal CLK in the clock modulation circuit 120 such that the functional circuit 110 may operate with a lower voltage.

FIG. 2A is a circuit block diagram illustrating an example of the voltage droop monitoring circuit in FIG. 1 according to some example embodiments.

Referring to FIG. 2A, the voltage droop monitoring circuit 200 may include a controller 210, a ring oscillator circuit block 300, a counter 230 and a droop detector 250. The controller 210 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The ring oscillator circuit block 300 may include a plurality of ring oscillators, which operate based on the power supply voltage VDD. The plurality of ring oscillators generate a plurality of oscillation signals. The ring oscillator circuit block 300 may select one of the plurality of oscillation signals to output a selected oscillation signal OSS.

The counter 230 may count a toggling of the selected oscillation signal OSS during a reference interval to output a counting signal (or, counting value) CV.

The droop detector 250 may compare the counting value CV with at least one threshold value to output the error signal ERR indicating whether droop occurs in the power supply voltage VDD. For example, the droop detector 250 detects droop if the court value CV falls below the threshold value. If the droop occurs in the power supply voltage VDD, the droop detector 250 may activate the error signal ERR with a first logic (high) level. If the droop disappears in the power supply voltage VDD, the droop detector 250 may deactivate the error signal ERR with a second logic (low) level. In example embodiments, if the droop occurs in the power supply voltage VDD, the droop detector 250 may output the error signal ERR including a plurality of bits indicating a degree of drop of the power supply voltage VDD.

The controller 210 controls the ring oscillator circuit block 300, the counter 230 and the droop detector 250. The controller 210 may provide the counter 230 with information on the reference interval and may provide the droop detector 250 with the at least one threshold value. The controller 210 controls the ring oscillator circuit block 300 by providing a first control signal CTL1 to the ring oscillator circuit block 300, controls the counter 230 by providing a second control signal CTL2 to the counter 230 and controls the droop detector 250 by providing a third control signal CTL3 to the droop detector 250.

The controller 210 receives the power supply voltage VDD, a reference voltage VREF and the status signal STS and may generate the first through third control signals CTL1, CTL2 and CTL3 based on the level of the power supply voltage VDD. In example embodiments, the controller 210 may generate the first through third control signals CTL1, CTL2 and CTL3 further based on the status signal STS.

Figure 2B:
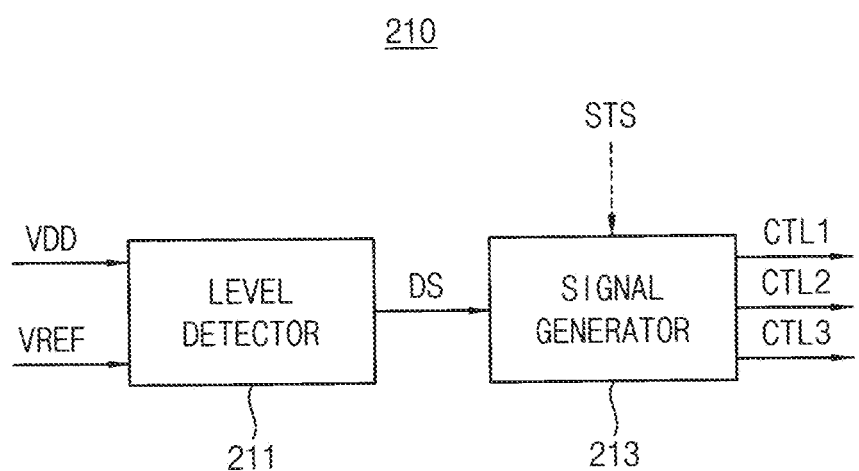
FIG. 2B is a circuit block diagram illustrating an example of the controller in the voltage droop monitoring circuit in FIG. 2A according to some example embodiments.

FIG. 2B is a circuit block diagram illustrating an example of the controller in the voltage droop monitoring circuit in FIG. 2A according to some example embodiments.

Referring to FIG. 2B, the controller 210 may include a level detector 211 and a signal generator 213.

The level detector 211 compares the level of the power supply voltage VDD with the reference voltage VREF and may output a detection signal DS with a first logic (high) level if the level of the power supply voltage VDD is lower than the reference voltage VREF.

The signal generator 213 may generate the first through third control signals CTL1, CTL2 and CTL3 based on the detection signal DS having a first logic level and may generate the first through third control signals CTL1, CTL2 and CTL3 further based on the status signal STS. In an alternative embodiment, the controller 210 may include one or more registers, look-up table(s), etc. that output the first-third control signals CTL1, CTL2, CTL3 based on the power supple voltage VDD and status signal STS. The generation of the control signal CTL1, CTL2 and CTL3 will be described in greater detail below.

Figure 3A:
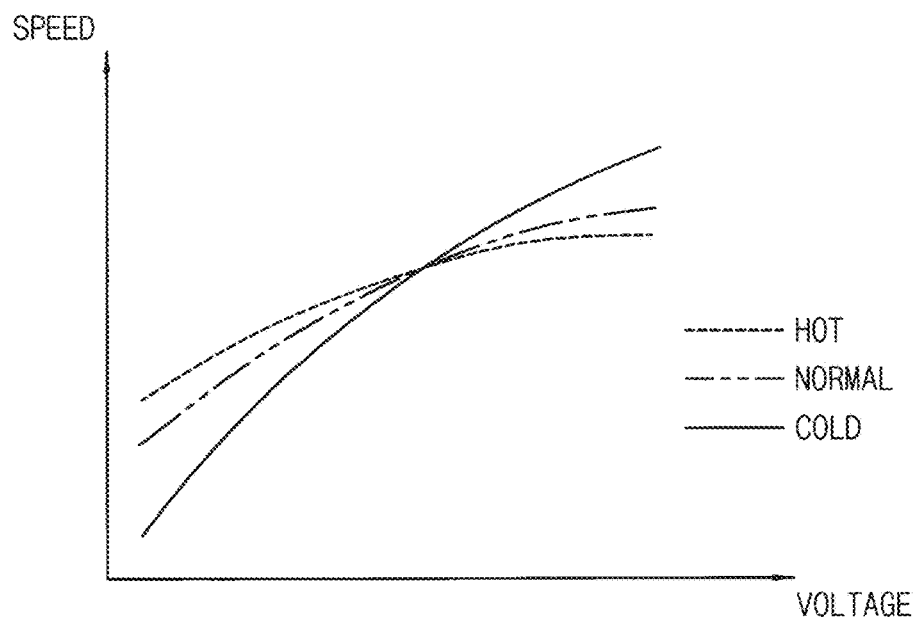
FIG. 3A illustrates an example relationship among a temperature, a level of the power supply voltage provided to a ring oscillator and a speed of the ring oscillator.

FIG. 3A illustrates an example relationship among a temperature, a level of the power supply voltage provided to a ring oscillator and a speed of the ring oscillator.

Referring to FIG. 3A, at a particular voltage, an example ring oscillator of the ring oscillators in the ring oscillator circuit block 300 operate faster at a higher temperature and a relatively low voltage, and the ring oscillator operates faster at a lower temperature and a relatively high voltage. When the SoC 10 operates, since various temperature changes occur and the level of the power supply voltage VDD changes frequently according to the DVFS, the temperature and the DVFS may be accounted for when the ring oscillator is employed for voltage droop monitoring. The controller 210 may provide the ring oscillator circuit block 300 with information on the temperature and the DVFS in the voltage droop monitoring circuit 200. The controller 210 may include the information on the temperature and the DVFS in the first control signal CTL1 and may provide the first control signal CTL1 to the ring oscillator circuit block 300. In response to the first control signal CTL1, the ring oscillator circuit block 300 may output the selected oscillation signal OSS that is robust with respect to changes in temperature.

Figure 3B:
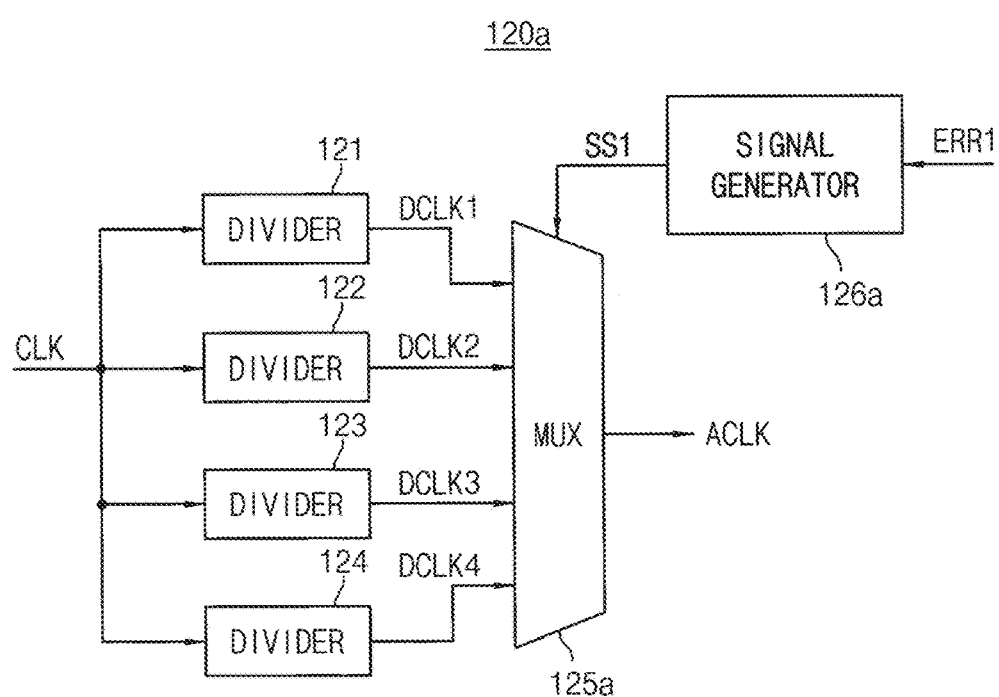
FIG. 3B is a circuit block diagram illustrating an example of the clock modulation circuit in the SoC of FIG. 1 according to some example embodiments.

FIG. 3B is a circuit block diagram illustrating an example of the clock modulation circuit in the SoC of FIG. 1 according to some example embodiments.

Referring to FIG. 3B, a clock modulation circuit 120a may include a plurality of frequency dividers 121, 122, 123 and 124, a multiplexer 125a and a signal generator 126a.

The signal generator 126a receives the first error signal ERR1, generates a selection signal SS1 corresponding to the first error signal ERR1 and provides the selection signal SS1 to the multiplexer 125a.

The frequency dividers 121, 122, 123 and 124 receive the clock signal CLK, divide the clock signal CLK with different division ratios and generate division clock signals DCLK1, DCLK2, DCLK3 and DCLK4 which have different frequencies. A frequency of the division clock signal DCLK1 may be the same as the frequency of the clock signal CLK, each frequency of the division clock signals DCLK2, DCLK3 and DCLK4 may be smaller than the frequency of the clock signal CLK. The frequency of division clock signals DCLK3 and DCLK4 may be less than the frequency of the division clock signal DCLK2, and the frequency of division clock DCLK4 may be less that the frequency of division clock DCLK3. The clock modulation circuit 120a may include any number of frequency dividers.

The multiplexer 125a selects one of the division clock signals DCLK1, DCLK2, DCLK3 and DCLK4 in response to the selection signal SS1 and outputs the selected one as the adaptive clock signal ACLK. In an example embodiment, look-up table in the signal generator 126a is programmed based on post manufacturing tests such that (1) a selection signal SS1 having a first selection value is output from the look-up table if the input error signal ERR1 indicates droop and (2) a selection signal SS1 having one or more second selection values over time are output if the input error signal ERR indicates an end of droop. By providing several selection options (e.g., dividers) during manufacture, a desired divider option for a droop state and a desired divider option or options over time for a non-droop may be set based on empirical study of the SoC 10 post manufacture.

Figure 3C:
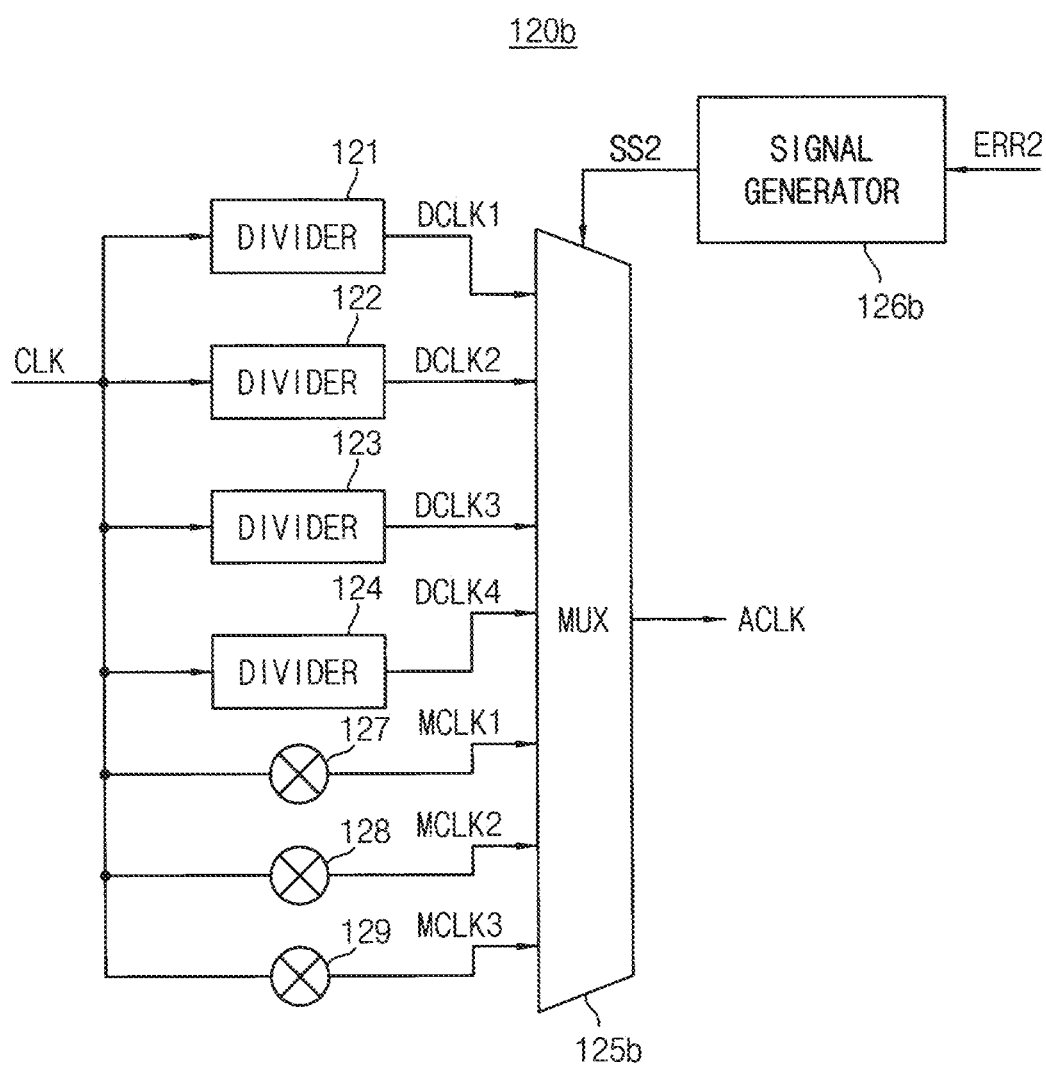
FIG. 3C is another circuit block diagram illustrating an example of the clock modulation circuit in the SoC of FIG. 1 according to some example embodiments.

FIG. 3C is another circuit block diagram illustrating an example of the clock modulation circuit in the SoC of FIG. 1 according to some example embodiments.

Referring to FIG. 3C, a clock modulation circuit 120b may include a plurality of frequency dividers 121, 122, 123 and 124, a plurality of multipliers 127, 128 and 129, a multiplexer 125b and a signal generator 126b.

In this embodiment, the signal generator 126b receives the second error signal ERR2 including a plurality of bits indicating a level of droop, generates a selection signal SS2 corresponding to the second error signal ERR2 and provides the selection signal SS2 to the multiplexer 125*b*.

The frequency dividers 121, 122, 123 and 124 receive the clock signal CLK, divide the clock signal CLK with different division ratios and generate division clock signals DCLK1, DCLK2, DCLK3 and DCLK4 which have different frequencies such as described with respect to the embodiment of FIG. 3B. The multipliers 127, 128 and 129 multiply the clock signal CLK with different multiplication ratios to generate multiplied clock signals MCLK1, MCLK2 and MCLK3. For example, a frequency of the multiplied clock signal MCLK1 may correspond to 90% of the frequency of the clock signal CLK, a frequency of the multiplied clock signal MCLK2 may correspond to 80% of the frequency of the clock signal CLK, and a frequency of the multiplied clock signal MCLK3 may correspond to 70% of the frequency of the clock signal CLK. The clock modulation circuit 120*b* may include any number of frequency dividers and any number of multipliers.

The multiplexer 125*b* selects one of the division clock signals DCLK1, DCLK2, DCLK3 and DCLK4 and the multiplied clock signals MCLK1, MCLK2 and MCLK3 in response to the selection signal SS2 and outputs the selected one as the adaptive clock signal ACLK. In an example embodiment, look-up table in the signal generator 126*a* is programmed based on post manufacturing tests such that (1) a selection signal SS2 selects a divider/multiplier based on the level of droop indicated by the error signal ERR2. By providing several selection options (e.g., dividers or multipliers) during manufacture, desired options associated with the level of droop may be set based on empirical study of the SoC 10 post manufacture.

Figure 4:
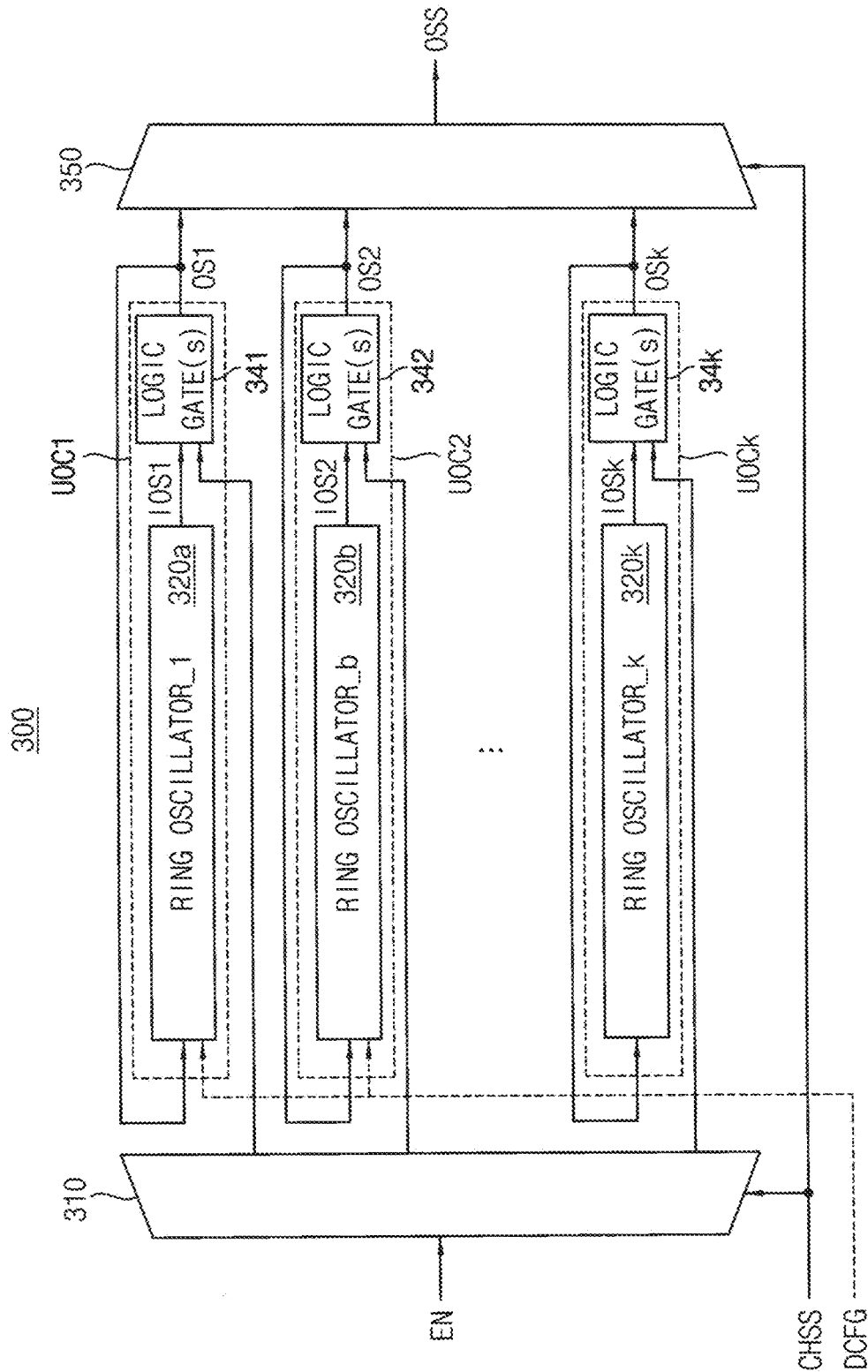
FIG. 4 is a circuit block diagram illustrating an example of the ring oscillator circuit block in FIG. 2A according to some example embodiments.

FIG. 4 is a circuit block diagram illustrating an example of the ring oscillator circuit block in FIG. 2A according to some example embodiments.

Referring to FIG. 4, the ring oscillator circuit block 300 may include a first selection circuit 310, a plurality of unit oscillator circuits UOC1~UOCk (k is an integer greater than two), and a second selection circuit 350.

The plurality of unit oscillator circuits UOC1~UOCk generate a plurality of oscillation signals OS1~OSk, respectively, based on the power supply voltage VDD. Each of the unit oscillator circuits UOC1~UOCk may include a corresponding one of a plurality of ring oscillators 320*a*~320*k* and a corresponding one of a plurality of logic gates 341~34*k*. Each of the ring oscillators, basically, in the ring oscillator circuit block 300 may output an oscillation signal having a higher frequency as a level of the voltage increases. In addition, each of the ring oscillators may have different frequency characteristic according to manufacturing process, cells included in each of the ring oscillators and temperature.

The ring oscillators 320*a*~320*k* may respectively generate intermediate oscillation signals IOS1~IOSk based on the power supply voltage VDD, and each of the logic gates 341~34*k* may perform a logical operation on a corresponding one of the intermediate oscillation signals IOS1~IOSk and an enable signal EN to generate a corresponding one of the oscillation signals OS1~OSk. For example, the logic gates 341~34*k* may be NAND gates that perform a NAND operation. The oscillation signal corresponding to a respective output of the logic gates 341~34*k* is fed-back to the respective first delay cell DC1 (see FIGS. 5A and 5B discussed below) in the respective ring oscillator 320. The enable signal EN may be selectively provided from the first selection circuit 310 based on a chain selection signal CHSS.

The first selection circuit 310 may provide the enable signal EN to at least some of the logic gates 341~34*k* in response to a chain selection signal CHSS.

The second selection circuit 350 may select one of the oscillation signals OS1~OSk to output the selected oscillation signal OSS in response to the chain selection signal CHSS.

The chain selection signal CHSS may determine a number of unit oscillator circuits which are associated with generating the selected oscillation signal OSS.

In an example, embodiment, the enable signal EN and the chain selection signal CHSS are provided by the controller 210 as part of the first control signal CTL1.

In an example embodiment, the controller 210 generates the enable signal EN periodically and for a fixed interval. The periodicity and interval are design parameters set through empirical study. These set values may be programmed, etc. in the controller 210.

In an example embodiment, the controller 210 includes a look-up table that outputs the chain selection signal CHSS based on one or more of the power supply voltage or voltage level (e.g., from the status signal STS). The look-up table is a design parameter set through empirical study.

In some example embodiments, the ring oscillators 320*a*~320*k* may generate the intermediate oscillation signals IOS1~IOSk further based on a delay configuration control signal DCFG as will be described below with respect to FIG. 5B.

Figure 5A:
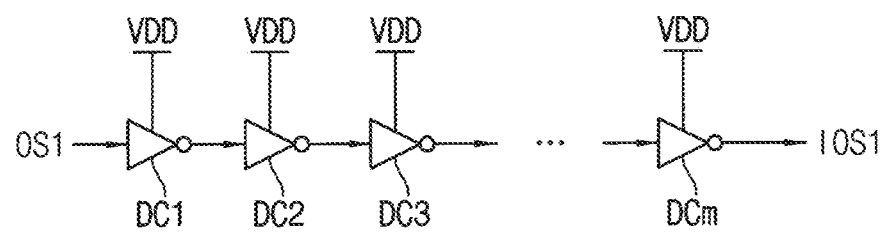
FIG. 5A is a circuit block diagram illustrating an example of a first ring oscillator in FIG. 4 according to some example embodiments.

FIG. 5A is a circuit block diagram illustrating an example of a first ring oscillator in FIG. 4 according to some example embodiments.

In FIG. 5A, a first ring oscillator 320*aa* is illustrated and each of other ring oscillators 320*b*~320*k* may have the same architecture as the first ring oscillator 320*aa*.

Referring to FIG. 5A, the first ring oscillator 320*aa* includes first through m_th delay cells DC1~DCm (m is an integer greater than three) which are cascaded-connected. The first through m_th delay cells DC1~DCm operate based in the power supply voltage VDD.

An output of the m th delay cell is provided as the first intermediate oscillation signal IOS1 and the first oscillation signal OC1 corresponding to an output of the NAND gate 341 is fed-back to the first delay cell DC1.

Figure 5B:
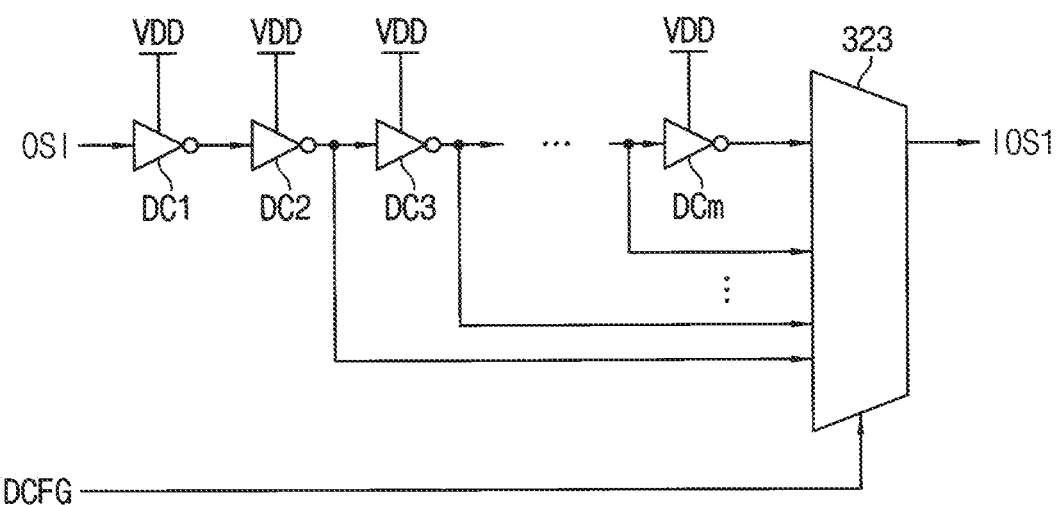
FIG. 5B is a circuit block diagram illustrating another example of a first ring oscillator in FIG. 4 according to some example embodiments.

FIG. 5B is a circuit block diagram illustrating another example of a first ring oscillator in FIG. 4 according to some example embodiments.

In FIG. 5B, a first ring oscillator 320*ab* is illustrated and each of other ring oscillators 320*b*~320*k* may have the same architecture as the first ring oscillator 320*ab*.

Referring to FIG. 5B, the first ring oscillator 320*ab* includes first through m_th delay cells DC1~DCm (m is an integer greater than three) which are cascaded-connected and a third selection circuit 323 The first through m_th delay cells DC1~DCm operate based in the power supply voltage VDD.

Outputs of the second through m_th delay cells DC2~DCm are provided to the third selection circuit 323 and the third selection circuit 323 may select one of the outputs the second through m_th delay cells DC2~DCm in response to the delay configuration control signal DCFG to output the first intermediate oscillation signal IOS1. Since the third selection circuit 323 may select one of the outputs of the second through m_th delay cells DC2~DCm in response to the delay configuration control signal DCFG, the delay configuration control signal DCFG may determine a number of delay cells which are associated with generating the intermediate oscillation signal IOS1. That is, the delay configuration control signal DCFG may adjust the amount of delay of the first intermediate oscillation signal IOS1. As such the delay control configuration signal DCFG affects the intrinsic speed of the ring oscillators under current operating conditions (e.g., voltage and temperature), and changes the sensitivity (oscillation speed) for detecting droop. In an example, embodiment, the controller 210 provides the delay control configuration signal DCFG as part of the first control signal CTL1. In an example embodiment, the controller 210 includes a look-up table that outputs the delay control configuration signal DCFG based on one or more of the power supply voltage or voltage level (e.g., from the status sign STS). The look-up table is a design parameter set through empirical study.

In FIGS. 5A and 5B, each of the first through m_th delay cells DC1~DCm may include one of an inverter, a NAND gate and a NOR gate, each of which operates based on the power supply voltage VDD.

FIG. 6 illustrates one of the delay cells in FIG. 5A or FIG. 5B.

In FIG. 6, a configuration of the first delay cell DC1 is illustrated and each of other delay cells DC2~DCm may have the same architecture as the first delay cell DC1.

Referring to FIG. 6, the first delay cell DC1 includes a p-channel metal-oxide semiconductor (PMOS) transistor PM1 and an n-channel metal-oxide semiconductor (NMOS) transistor NM1 connected between the power supply voltage VDD and a ground voltage VSS.

The PMOS transistor PM1 has a source connected to the power supply voltage VDD, a gate connected to a first node N11 and a drain connected to a second node N12. The NMOS transistor NM1 has a drain connected to the second node N12, a source connected to the ground voltage VSS and a gate connected to the first node N11. That is, the first delay cell DCI may be implemented as an inverter.

A switching speed of the first delay cell DC1, which is implemented as an inverter, is sensitive to the power supply voltage VDD. Therefore, outputs of the ring oscillators 320a~320k may reflect change of the power supply voltage VDD. Increase of the counting value CV, which is obtained by counting toggling of the selected oscillation signal OSS during a reference interval, may indicate increase of the level of the power supply voltage VDD and decrease of the counting value CV may indicate decrease of the level of the power supply voltage VDD.

Returning to FIG. 2, the controller 210 supplies the counter 230 with the enable signal EN and a reset signal as the second control signal CTL2. The controller 210 sets the reset signal to reset the counter 230 at the beginning of the enable period. The counter 230 counts the selected oscillation signal pulses during the enable period to generate the count value CV. As will be appreciated, the enable signal EN supplied to the counter 230 may be delayed to as compared to the enable signal EN supplied to the ring oscillator circuit block 300 to account for delays in the ring oscillator circuit block 300.

In an alternative embodiment, the signal generator 213 may activate an enable signal included in the first control signal CTL1 if the level of the power supply voltage VDD is lower than the reference voltage VREF and provide the activated enable signal to the ring oscillator circuit block 300 and the counter 230. This reduces power consumption.

FIG. 7A is a circuit block diagram illustrating an example of the droop detector in FIG. 2A according to some example embodiments.

Referring to FIG. 7A, a droop detector 250a may include a register 251 and a comparator 253.

The register 251 stores a first threshold value LTH and a second threshold value UNTH and provides the first threshold value LTH and the second threshold value UNTH to the comparator 251. The controller 210 in FIG. 2A may provide the first threshold value LTH and the second threshold value UNTH to the droop detector 250 as part of the third control signal CTL3, and the controller 210 may adjust levels of the first threshold value LTH and the second threshold value UNTH according to the DVFS (e.g., changes in the reference voltage VREF) and a change of the power supply voltage VDD. In an example embodiment, the controller 210 includes a look-up table, that outputs the threshold values based on the reference voltage VREF and/or the power supply voltage VDD. The look-up table is a design parameter set through empirical study. In addition, the reference voltage VREF changes due to various voltage changes according to the DVFS, and the counting value CV of the ring oscillator also changes. Therefore, the DVFS may be considered.

The comparator 253 compares the counting value CV with the first threshold value LTH and the second threshold value UNTH to output the first error signal ERR1.

Figure 7B:
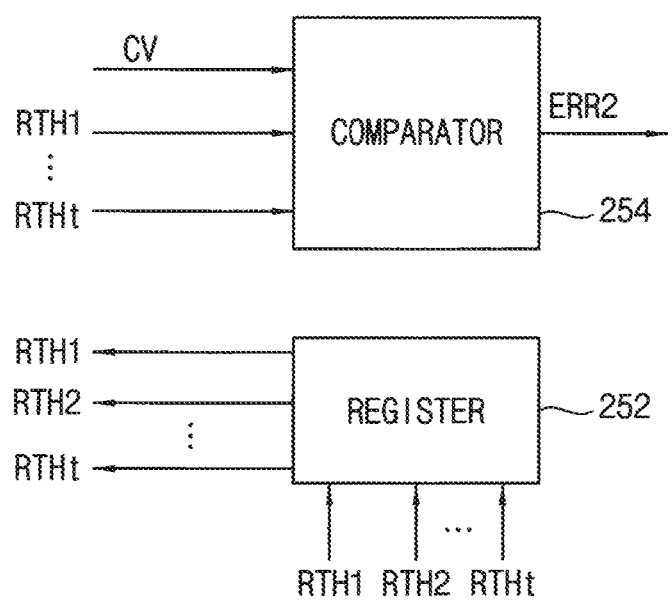
FIG. 7B is a circuit block diagram illustrating another example of the droop detector in FIG. 2A according to some example embodiments.

FIG. 7B is a circuit block diagram illustrating another example of the droop detector in FIG. 2A according to some example embodiments.

Referring to FIG. 7B, a droop detector 250b may include a register 252 and a comparator 254.

The register 252 stores a plurality of threshold values RTH1~RTHt (t is an integer greater than two) and provides the threshold values RTH1~RTHt to the comparator 252. The controller 210 in FIG. 2A may provide the threshold values RTH1~RTHt to the droop detector 250 as part of the third control signal CTL3, and the controller 210 may adjust levels of the threshold values RTH1~RTHt according to the DVFS (e.g., the reference voltage VREF) and a change of the power supply voltage VDD. In an example embodiment, the controller 210 includes a look-up table, that outputs the threshold values based on the reference voltage VREF and/or the power supply voltage VDD. The look-up table is a design parameter set through empirical study. In addition, the reference voltage VREF changes due to various voltage changes according to the DVFS, and the counting value CV of the ring oscillator also changes. Therefore, the DVFS may be considered.

The comparator 254 compares the counting value CV with the threshold values RTH1~RTHt to output the second error signal ERR2. The comparator 254 outputs the second error signal ERR2 including a plurality of bits indicating difference between the counting value CV and at least one of the threshold values RTH1~RTHt. That is, the second error signal ERR2 may indicates a degree of droop of the power supply voltage VDD. The signal generator 126b in the clock modulation circuit 120b of FIG. 3C generates the selections signal SS2 in response to the second error signal ERR2, and thus the clock modulation circuit 120b may output the adaptive clock signal ACLK which has a frequency depending on the degree of the droop (voltage droop).

Figure 8:
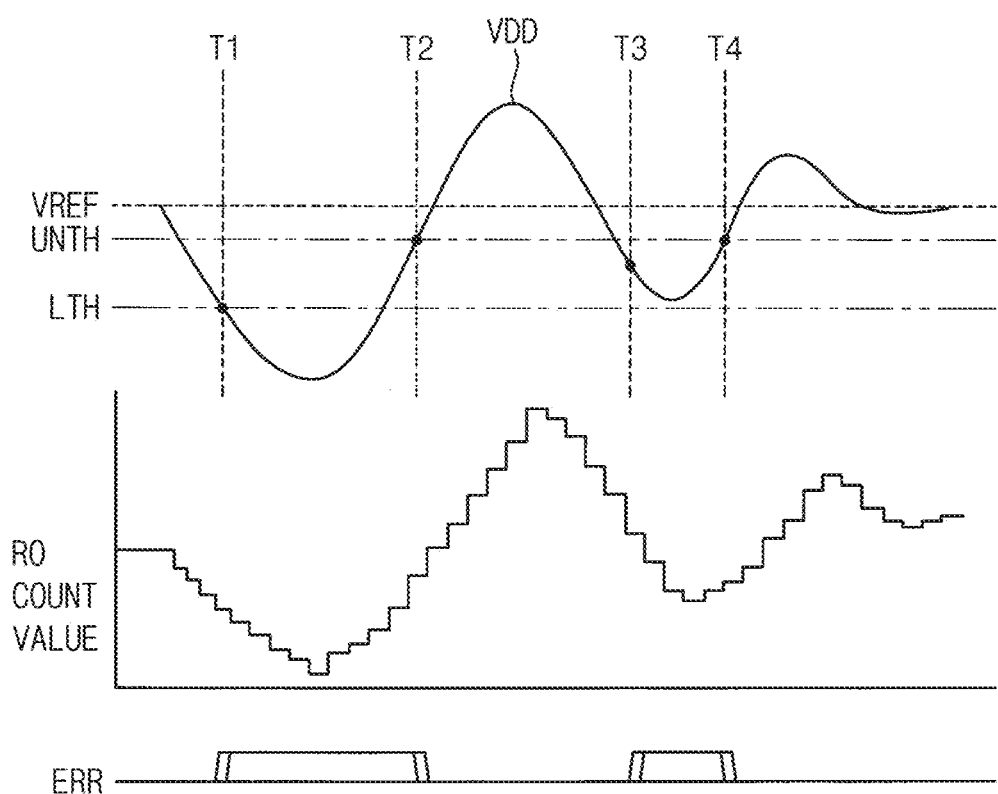
FIG. 8 illustrates an example of operation of the voltage droop monitoring circuit of FIG. 2A according to some example embodiments.

FIG. 8 illustrates an example of operation of the voltage droop monitoring circuit of FIG. 2A according to some example embodiments.

In FIG. 8, VREF denotes a reference voltage provided to the controller 210, LTH denotes a first threshold value, UNTH denotes a second threshold value and RO count value denotes the counting value of the counter 230.

Referring to FIGS. 2A through 8, the droop detector 250 may transit the first error signal ERR1 to a first logic level in response to the counting value CV corresponding to the power supply voltage VDD being lower than the first threshold value LTH.

If the counting value CV increases after the droop occurs in the power supply voltage VDD and the counting value CV rises above the second threshold value UNTH, the droop detector 250 may transit the first error signal ERR1 to a second logic level from the first logic level in response to the corresponding counting value.

In FIG. 8, the first error signal ERR1 indicates that the droop occurs in the power supply voltage VDD between a first timing point T1 and a second timing point T2 and indicates that droop occurs in the power supply voltage VDD between a third timing point T3 and a fourth timing point T4.

If the droop occurs in the power supply voltage VDD, a frequency of the clock signal CLK needs to be adjusted quickly, and the adaptive clock signal ACLK is provided from the clock modulation circuit 120 by dividing or multiplexing the clock signal CLK in the clock modulation circuit 120 instead of adjusting the frequency of the clock signal CLK in the clock generator 130.

If the frequency of the clock signal CLK is decreased at a droop error point in which the droop occurs and then the frequency of the clock signal CLK is recovered to its original frequency when the droop error disappears, there is possibility that another droop occurs in the power supply voltage VDD due to faster operation of a circuit. For preventing another immediate droop, the droop error is released at a level equal to or higher than a level at which the droop error occurs. This prevents ping-pong between droop and non-droop states of operation.

In addition, the frequency of the clock signal CLK may be gradually increased. For example, the frequency of the clock signal CLK may be gradually increased to its original frequency in a circuit operating very fast and the frequency of the clock signal CLK may be more quickly increased to its original frequency in a circuit operating slowly.

For example, in one embodiment, the signal generator 126a of FIG. 3B is configured such that if the error signal ERR1 indicates droop, the signal generator 126a generates a selection signal SS1 to select a divider (or multiplier, etc.) that divides the clock signal CLK (e.g., divides the clock signal CLK in half) to generate the adaptive clock signal ACLK where the ratio off the two clocks ACLK/CLK is a first ratio (e.g., ½). And, the signal generator 126a is configured to change the selection signal SS1 periodically, in response to the error signal ERR1 indicating no droop, such that different dividers are selected and the ratio of the two clocks ACLK/CLK increases each time (e.g., ⅔, ¾, ⅘, 1) until the adaptive clock signal ACLK returns to a pre-droop or non-droop state (e.g., equals the clock signal CLK (e.g., is divided by 1)). While not shown in FIG. 3B, the clock signal CLK may also be directly supplied to the multiplexer 125a as an input. In one embodiment, the voltage droop monitoring circuit 200 may employ a calibration operation that automatically calculates the counting value CV of the ring oscillator corresponding to a changed level of the power supply voltage VDD according to the DVFS.

Therefore, the voltage droop monitoring circuit 200 and the SoC 10 including the voltage droop monitoring circuit 200 may count an oscillation signal that varies in response to the power supply voltage VDD provided to the functional circuit 110, detects the droop in the power supply voltage VDD and may lower operating voltage by decreasing a frequency of the clock signal provided to the functional circuit 110. Therefore, the voltage droop monitoring circuit 200 may reduce power consumption of the SoC 10.

In addition, if the voltage droop monitoring circuit 200 employs the droop detector 250b of FIG. 7B, the SoC 10 may adaptively adjust the frequency of the clock signal CLK in response to the second error signal ERR2 indicating a degree of the droop.

In this embodiment, and referring to FIG. 3C, the signal generator 126b is configured to generate the selection signal SS2 based on the level of droop indicated by the error signal ERR2. For example, if the error signal ERR2 indicates no droop, the signal generator 126b generates a selection signal SS2 such that the multiplexer 125b selects a divider that divides the clock signal CLK by 1, or a multiplier that multiplies the clock signal by 1. Alternative, the clock signal CLK may be directly supplied to the multiplexer 125b and selected if no droop exists. If the error signal ERR2 indicates droop, the error signal ERR2 also indicates the level of droop. For example, the threshold values RTH1 . . . RTHt are decreasing values that define the levels of droop. A count value CV falling between RTH1 and RTH2 indicates a first level of droop, a count value CV falling between RTH2 and RTH3 indicates a second level of droop greater than the first level of droop, etc. The signal generator 126b generates a selection signal SS2 such that the multiplexer 125b selects a divider or multiplier corresponding to the level of droop. For example, the clock signal CLK may be reduced by ⅘ for a first level of droop, ¾ for a second level of droop, ⅔ for a third level of droop, etc. to generate the adaptive clock signal ACLK. As such, the clock modulation circuit 120 is configured to change a frequency of the adaptive clock signal ACLK based on the level of droop. More particularly, the clock modulation circuit 120 is configured to decrease the frequency of the adaptive clock signal ACLK as the level of droop increases, and is configured to increase the frequency of the adaptive clock signal ACLK as the level of droop decreases.

As with the embodiment of FIG. 7A, each of the first plurality of threshold values RTH1 . . . RTHt, may have a corresponding plurality of second threshold voltages URTH1 . . . URTHt, where each second threshold voltage of the plurality of second threshold voltages is greater than the respective first threshold voltage. Here, as described above, the plurality of first threshold values RTH1 . . . RTHt decrease in value, and are associated with a different level of droop in the power supply voltage. Here, transitioning from a greater level of droop to a lower level of droop requires the count value CV falling above the corresponding second threshold value. This prevents ping ponging between different levels of droop. In one embodiment, while the second threshold value is greater than the corresponding first threshold value, this second threshold value is less than the next first threshold value indicate a lower level of droop.

Accordingly, the droop detector 250 is configured to detect droop in response to the count value CV falling below one of the plurality of first threshold values, is configured to detect the level of droop based on a lowest one of the plurality of first threshold values the count value falls below, and is configured to detect a reduced level of droop in response to the count value rising above the second threshold value associated with the lowest one of the plurality of first threshold values the count value falls below.

Figure 9:
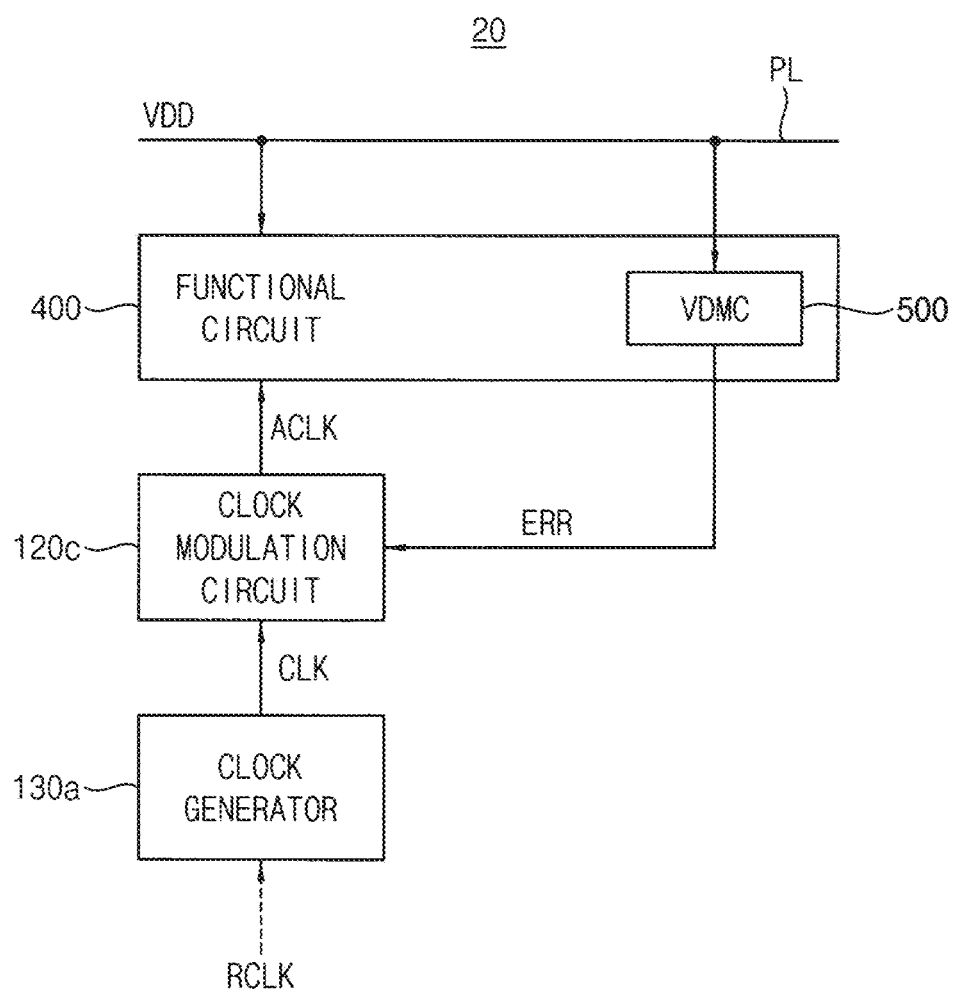
FIG. 9 is a circuit block diagram illustrating another example of an SoC according to some example embodiments.

FIG. 9 is a circuit block diagram illustrating another example of an SoC according to example embodiments.

Referring to FIG. 9, an SoC 10 includes a functional circuit 400, a clock modulation circuit 120c, a clock generator 130a and a voltage droop monitoring circuit (VDMC) 500.

The voltage droop monitoring circuit 500 may be disposed inside the functional circuit 400.

The functional circuit 400 may operate by receiving a power supply voltage VDD through a power line PL and may perform a plurality of functions.

The voltage droop monitoring circuit 500 may receive the power supply voltage VDD through the power line PL, may monitor a level of the power supply voltage VDD and may provide the clock modulation circuit 120c with an error signal ERR if a droop occurs in the power supply voltage VDD.

The clock generator 130a may be implemented with a phase-locked loop (PLL), may generate at least one clock signal CLK(s) based on a reference clock RCLK may provide the clock signal CLK to the clock modulation circuit 120c.

The clock modulation circuit 120c may receive the error signal ERR and the clock signal CLK, may generate a corresponding adaptive clock signal ACLK by modulating the clock signal CLK and provide the adaptive clock signal ACLK to the functional circuit 400. The clock modulation circuit 120c may be the same as the clock modulation circuit 120a or 120b, and the error signal ERR may include a single bit or a plurality or bits as described above with respect to the embodiments of FIGS. 1-8.

The functional circuit 400 may include a plurality of function circuit blocks that operate based on the adaptive clock signal ACLK.

Figure 10:
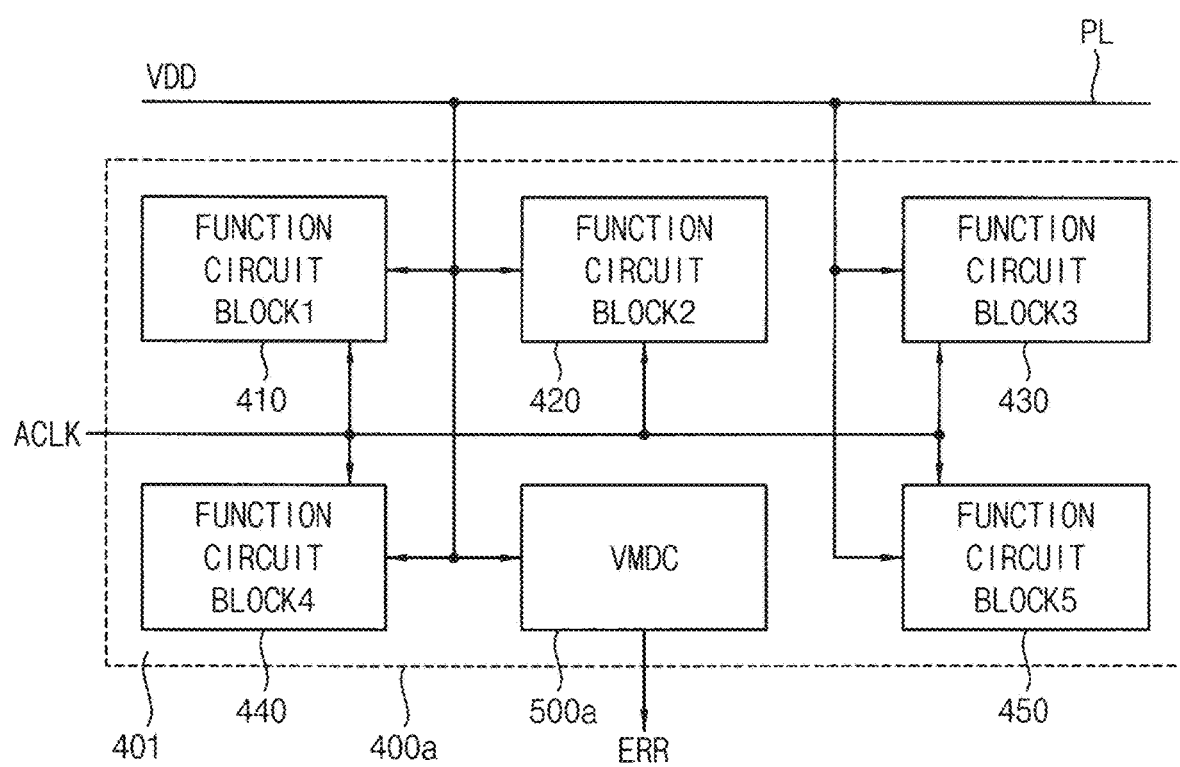
FIG. 10 is a circuit block diagram illustrating an example of the functional circuit in FIG. 9 according to some example embodiments.

FIG. 10 is a circuit block diagram illustrating an example of the functional circuit in FIG. 9 according to some example embodiments.

Referring to FIG. 10, a functional circuit 400a may include a plurality of function circuit blocks 410, 420, 430, 440 and 450 and the voltage droop monitoring circuit 500a which are mounted on a circuit board 401.

The function circuit blocks 410, 420, 430, 440 and 450 perform corresponding functions respectively by receiving the power supply voltage VDD and may adjust operating speed based on a frequency of the adaptive clock signal ACLK.

The voltage droop monitoring circuit 500a may receive the power supply voltage VDD through the power line PL, may monitor a level of the power supply voltage VDD, may generate the error signal ERR indicating whether a droop occurs in the power supply voltage VDD and may provide the error signal ERR to the clock modulation circuit 120c in FIG. 9. The voltage droop monitoring circuit 500a may employ the voltage droop monitoring circuit 200 of FIG. 2A.

Figure 11:
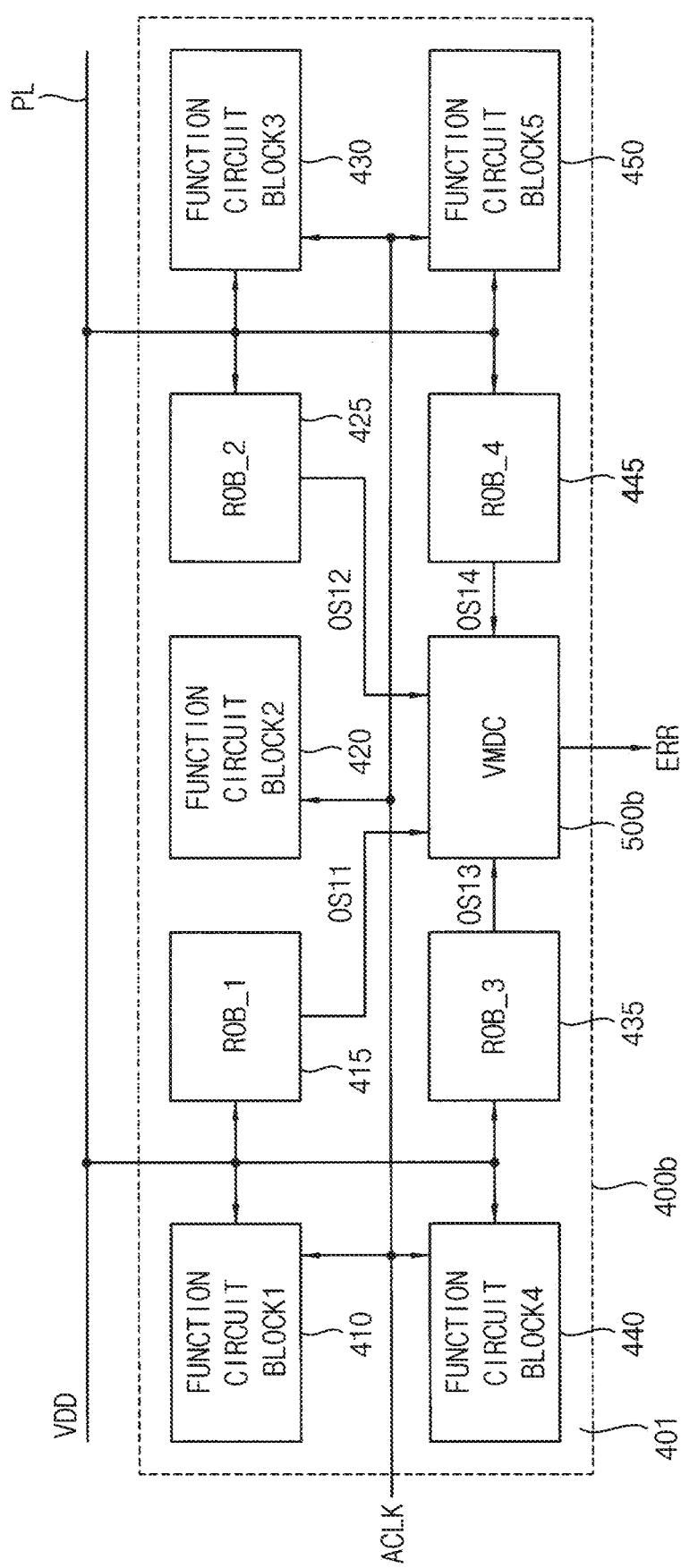
FIG. 11 is a circuit block diagram illustrating another example of the functional circuit in FIG. 9 according to some example embodiments.

FIG. 11 is a circuit block diagram illustrating another example of the functional circuit in FIG. 9 according to some example embodiments.

Referring to FIG. 11, a functional circuit 400b may include a plurality of function circuit blocks 410, 420, 430, 440 and 450, a plurality of ring oscillator circuit blocks 415, 425, 435 and 445 and a voltage droop monitoring circuit 500b which are mounted on a circuit board 401.

The function circuit blocks 410, 420, 430, 440 and 450 perform corresponding functions respectively by receiving the power supply voltage VDD and may adjust operating speed based on a frequency of the adaptive clock signal ACLK.

The ring oscillator circuit blocks 415, 425, 435 and 445 are distributed and disposed on the circuit board 401. The ring oscillator circuit blocks 415, 425, 435 and 445 generate selected oscillation signals OSS11, OSS12, OSS13, OSS14 and provide the selected oscillation signals OSS11, OSS12, OSS13 and OSS14 to the voltage droop monitoring circuit 500b.

The ring oscillator circuit block 415 may be adjacent to the function circuit block 410, the ring oscillator circuit block 425 may be adjacent to the function circuit block 430, the ring oscillator circuit block 435 may be adjacent to the function circuit block 440, and the ring oscillator circuit block 445 may be adjacent to the function circuit block 450. Each of the ring oscillator circuit blocks 415, 425, 435 and 445 may provide the voltage droop monitoring circuit 500b with corresponding the selected oscillation signals OSS11, OSS12, OSS13 and OSS14. Each of the selected oscillation signals OSS11, OSS12, OSS13 and OSS14 may reflect a voltage change of the power supply voltage VDD provided to corresponding one of adjacent function circuit block.

The voltage droop monitoring circuit 500b receives the selected oscillation signals OSS11, OSS12, OSS13 and OSS14 and provides the error signal ERR to the clock modulation circuit 120c in FIG. 9 if the droop is detected in at least one of the selected oscillation signals OSS11, OSS12, OSS13 and OSS14. As described in previous embodiments, the error signal ERR may include a single bit of a plurality of bits as mentioned above. The voltage droop monitoring circuit 500b may generate counting values by counting toggling of the selected oscillation signals OSS11, OSS12, OSS13 and OSS14, may compare the counting values with at least one threshold value, and may output the error signal ERR with a first logic level indicating that the droop occurs if the at least one of the counting values is equal to or smaller than the at least one threshold value. In example embodiments, the voltage droop monitoring circuit 500b may compare the counting values with a plurality of threshold values and may output the error signal ERR, which as described in previous embodiments includes a plurality of bits to indicate a level of droop.

Figure 12:
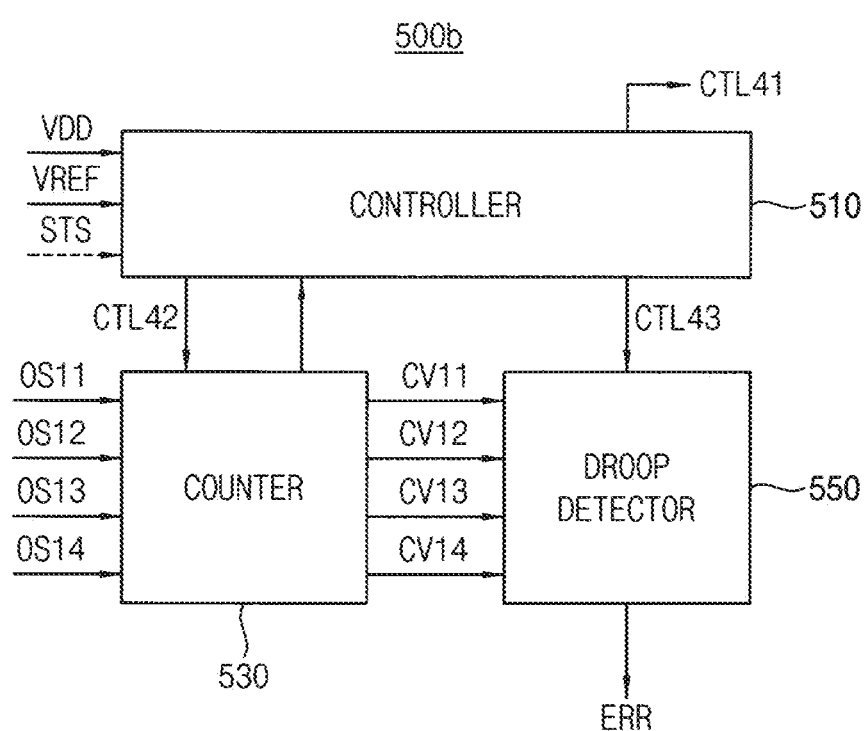
FIG. 12 is a circuit block diagram illustrating an example of the voltage droop monitoring circuit in FIG. 11 according to some example embodiments.

FIG. 12 is a circuit block diagram illustrating an example of the voltage droop monitoring circuit in FIG. 11 according to some example embodiments.

Referring to FIG. 12, the voltage droop monitoring circuit 500b includes a controller 510, a counter 530 and a droop detector 550. The controller 510 may include processing circuitry such as hardware including logic circuits; a hardware/software combination such as a processor executing software; or a combination thereof. For example, the processing circuitry more specifically may include, but is not limited to, a central processing unit (CPU) , an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The counter 530 may count a toggling of each of the selected oscillation signals OSS11, OSS12, OSS13 and OSS14 to output a plurality of counting values CV11, CV12, CV13 and CV14.

The droop detector 550 may compare each of the counting values CV11, CV12, CV13 and CV14 with at least one threshold value to generate the error signal ERR indicating whether the droop occurs in the power supply voltage VDD based on a result of the comparison. The droop detector 550 may output the error signal ERR with a first logic level if at least one of the counting values CV11, CV12, CV13 and CV14 decreases below a first threshold value, and may transit the error signal ERR with a second logic level from the first logic level if the droop is released or disappears (e.g., exceeds a second threshold value greater than the first threshold. If the at least one of the counting values CV11, CV12, CV13 and CV14 is between the first and second threshold values, the droop detector 550 may output the error signal ERR including a plurality of bits that indicate the difference between the at least one of the counting values CV11, CV12, CV13 and CV14 and the threshold values.

The controller 510 controls the ring oscillator circuit blocks 415, 425, 435 and 445, the counter 530 and the droop detector 550. The controller 510 may provide the counter 530 with information on the reference interval and may provide the droop detector 550 with the at least one threshold value. The controller 510 controls the ring oscillator circuit blocks 415, 425, 435 and 445 by providing a first control signal CTL41 to the ring oscillator circuit blocks 415, 425, 435 and 445, controls the counter 530 by providing a second control signal CTL42 to the counter 530 and controls the droop detector 550 by providing a third control signal CTL43 to the droop detector 550. The second control signal CTL42 may include the information on the reference interval and the third control signal CTL43 may include the at least one threshold value.

The controller 510 receives the power supply voltage VDD, a reference voltage VREF and the status signal STS and may generate the first through third control signals CTL41, CTL42 and CTL43 based on the level of the power supply voltage VDD. In example embodiments, the controller 510 may compare the power supply voltage VDD and the reference voltage VREF and may operate the ring oscillator circuit blocks 415, 425, 435 and 445 by using the first control signal CTL41 if the power supply voltage VDD lowers than the reference voltage VREF.

The controller 510 may include a level detector and a signal generator as described with reference to FIG. 2B.

Figure 13:
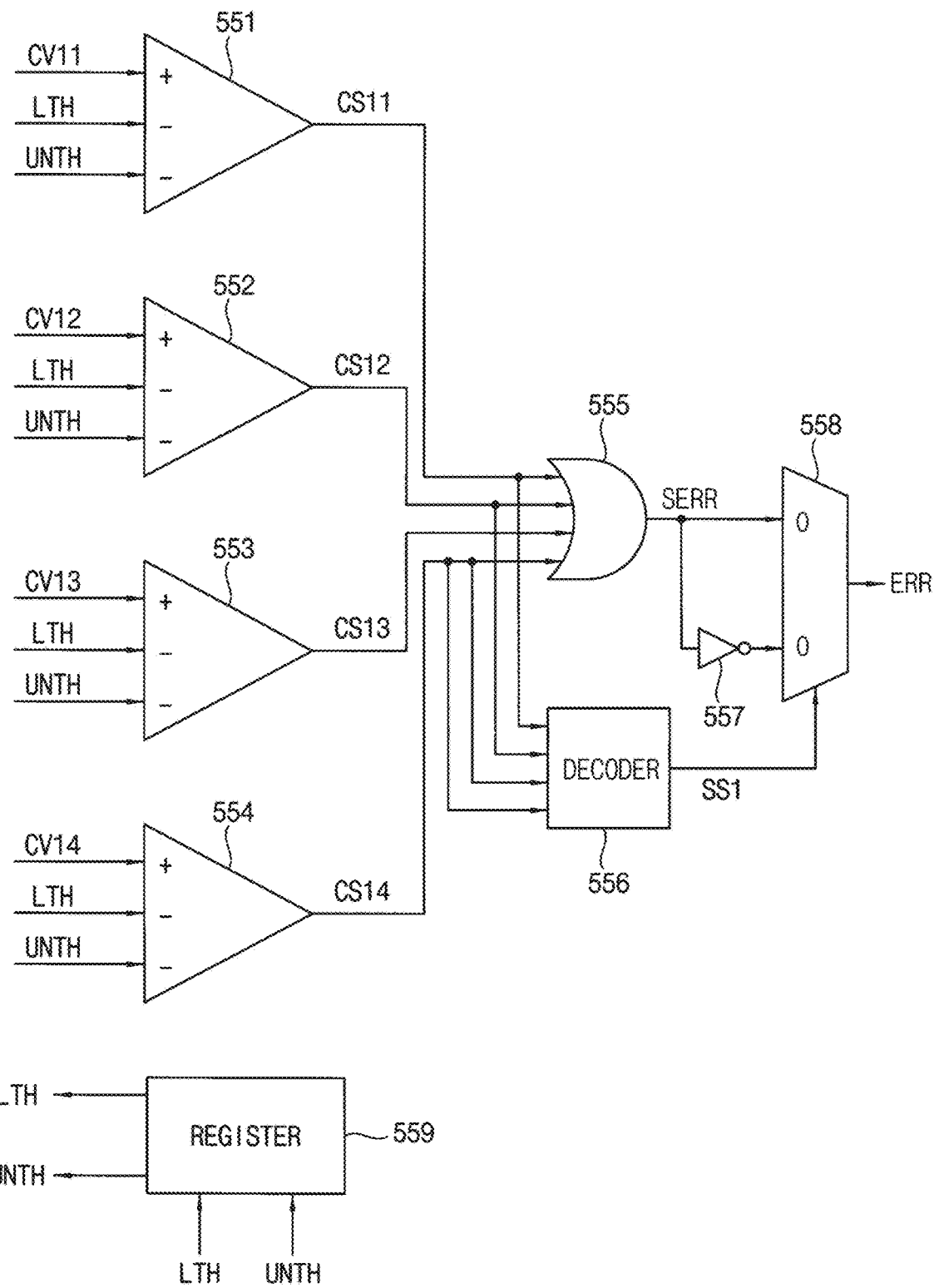
FIG. 13 is a circuit block diagram illustrating an example of the droop detector in FIG. 12 according to some example embodiments.

FIG. 13 is a circuit block diagram illustrating an example of the droop detector in FIG. 12 according to some example embodiments.

Referring to FIG. 13, the droop detector 550 may include a register 559, a plurality of comparators 551, 552, 553 and 554, an OR gate 555, a decoder 556, an inverter 557 and a multiplexer 558.

The register 559 stores a first threshold value LTH and a second threshold value UNTH and provides the first threshold value LTH and the second threshold value UNTH to each of the comparators 551, 552, 553 and 554. The controller 510 in FIG. 12 may provide the first threshold value LTH and the second threshold value UNTH and may adjust levels of the first threshold value LTH and the second threshold value UNTH according to the DVFS and a change of the power supply voltage VDD.

The first comparator 551 compares the first counting value CV11 with the first threshold value LTH and the second threshold value UNTH to output the first comparison signal CS11. The second comparator 552 compares the second counting value CV12 with the first threshold value LTH and the second threshold value UNTH to output the second comparison signal CS12. The third comparator 553 compares the third counting value CV13 with the first threshold value LTH and the second threshold value UNTH to output the third comparison signal CS13. The fourth comparator 554 compares the fourth counting value CV14 with the first threshold value LTH and the second threshold value UNTH to output the fourth comparison signal CS14.

The OR gate 555 performs an OR operation on the first through fourth comparison signals CS11, CS12, CS13 and CS14 to output a sub error signal SERR.

The decoder 556 decodes the first through fourth comparison signals CS11, CS12, CS13 and CS14 to output a selection signal SS3.

The multiplexer 558 may select one of the sub error signal SERR and an output of the inverter 557 that inverts the sub error signal SERR in response to the selection signal SS1 to output the selected one as the error signal ERR.

Therefore, if the at least one of the first through fourth comparison signals CS11, CS12, CS13 and CS14 has a high level, that is, a droop condition is detected in at least one of the first through fourth counting values CV11, CV12, CV13 and CV14, the multiplexer 558 outputs the error signal ERR with a high level. In addition, if each of the first through fourth comparison signals CS11, CS12, CS13 and CS14 has a low level, that is, a droop condition is detected in each of the first through fourth counting values CV11, CV12, CV13 and CV14, the multiplexer 558 outputs the error signal ERR with a low level.

For example, if the first comparison signal CS1 is a high level and each of the second through fourth comparison signals CS12, CS13 and CS14 has a low level, the first comparison signal CS1 may indicate the droop (condition) occurs in the power supply voltage VDD due to the first function circuit block 410. The OR gate 555 outputs the sub error signal SERR with a high level in response to the first comparison signal CS1 with a high level and the decoder 556 outputs the selection signal SS3 with a low level. Therefore, the multiplexer 558 outputs the error signal ERR with a high level.

If the clock modulation circuit 120a decreases a frequency of the adaptive clock signal ACLK in response to the error signal ERR and the droop (condition) due to the first function circuit block 410 is released, each of the first through fourth comparison signals CS11, CS12, CS13 and CS14 has a low level.

The OR gate 555 outputs the sub error signal SERR with a low level and the decoder 556 outputs the selection signal SS3 with a low level. Therefore, the multiplexer 558 outputs the error signal ERR with a low level.

Figure 14:
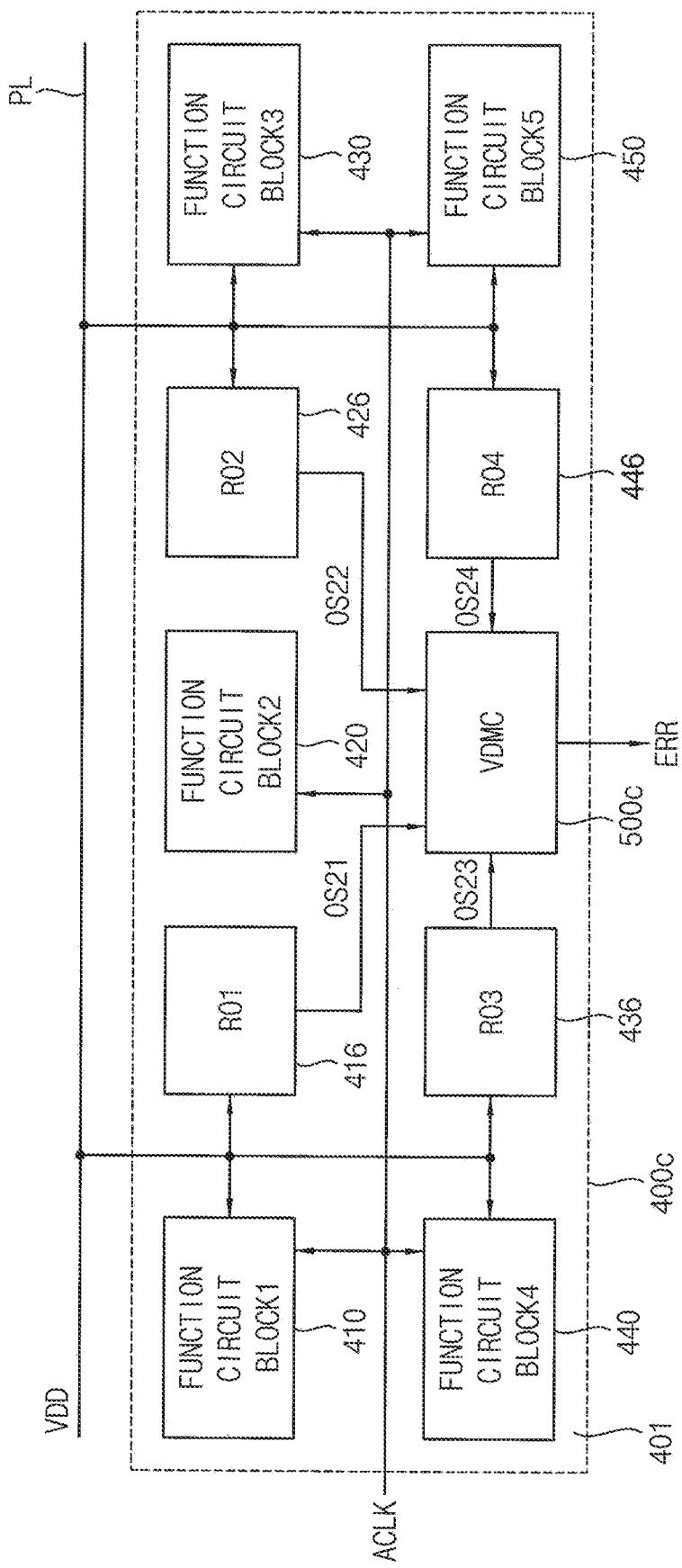
FIG. 14 is a circuit block diagram illustrating another example of the functional circuit in FIG. 9 according to some example embodiments.

FIG. 14 is a circuit block diagram illustrating another example of the functional circuit in FIG. 9 according to some example embodiments.

Referring to FIG. 14, a functional circuit 400c may include a plurality of function circuit blocks 410, 420, 430, 440 and 450, a plurality of ring oscillator 416, 426, 436 and 446 and a voltage droop monitoring circuit 500c which are mounted on a circuit board 401.

The function circuit blocks 410, 420, 430, 440 and 450 perform corresponding functions respectively by receiving the power supply voltage VDD and may adjust operating speed based on a frequency of the adaptive clock signal ACLK.

The ring oscillators 416, 426, 436 and 446 are distributed and disposed on the circuit board 401. The ring oscillators 416, 426, 436 and 446 generate oscillation signals OS21, OS22, OS23, OS24 an and provide the oscillation signals OS21, OS22, OS23, OS24 to the voltage droop monitoring circuit 500c.

The ring oscillator 416 may be disposed adjacent to the function circuit block 410, the ring oscillator 426 may be disposed adjacent to the function circuit block 430, the ring oscillator 436 may be disposed adjacent to the function circuit block 440, and the ring oscillator 446 may be disposed adjacent to the function circuit block 450. Each of the ring oscillators 416, 426, 436 and 446 may provide the voltage droop monitoring circuit 500c with corresponding one of the oscillation signals OS21, OS22, OS23, OS24.

Each of the oscillation signals OS21, OS22, OS23, OS24 may reflect a voltage change of the power supply voltage VDD provided to corresponding one of adjacent function circuit block.

The voltage droop monitoring circuit 500c receives the oscillation signals OS21, OS22, OS23, OS24 and provides the error signal ERR to the clock modulation circuit 120c in FIG. 9 if the droops is detected in at least one of the oscillation signals OS21, OS22, OS23, OS24. The error signal ERR may include a single bit of a plurality of bits as mentioned above. The voltage droop monitoring circuit 500c may generate counting values by counting toggling of the oscillation signals OS21, OS22, OS23, OS24, may compare the counting values with at least one threshold value, and may output the error signal ERR with a first logic level indicating that the droop occurs if the at least one of the counting values is equal to or smaller than the at least one threshold value. In example embodiments, the voltage droop monitoring circuit 500c may compare the counting values with a plurality of threshold values and may output the error signal ERR including a plurality of bits which indicate difference between at least one of the counting values and the threshold values.

The voltage droop monitoring circuit 500c may have a similar configuration with the voltage droop monitoring circuit 500c of FIG.

Figure 15:
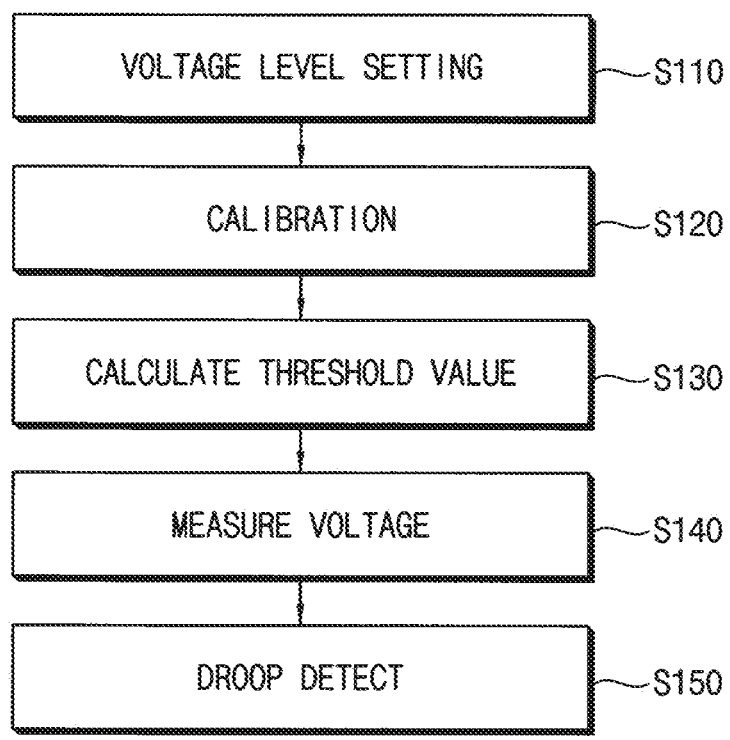
FIG. 15 is a flow chart illustrating a method of operating a voltage droop monitoring circuit according to some example embodiments.

FIG. 15 is a flow chart illustrating a method of operating a voltage droop monitoring circuit according to example embodiments.

Referring to FIGS. 2A through 15, a power management integrated circuit (PMIC) that provides the power supply voltage VDD sets a level of the power supply voltage VDD which is provided to delay cells of each of ring oscillators (S110).

The counter 230 in the voltage droop monitoring circuit 200 calculates (calibrates) a counting value CV output from each of the ring oscillators at a set level of the power supply voltage VDD (S210).

The controller 210 in the voltage droop monitoring circuit 200 calculates the first threshold value LTH and the second threshold value UNTH based on the counting value CV (S130).

The voltage droop monitoring circuit 200 measures the level of the power supply voltage VDD (S140). The voltage droop monitoring circuit 200 counts the selected oscillation signal OSS from the ring oscillator circuit block 300 at a measured level of the power supply voltage VDD to detect whether the droop occurs in the power supply voltage VDD (S150). If the droop is detected, the voltage droop monitoring circuit 200 outputs the error signal ERR with a first logic level.

Figure 16:
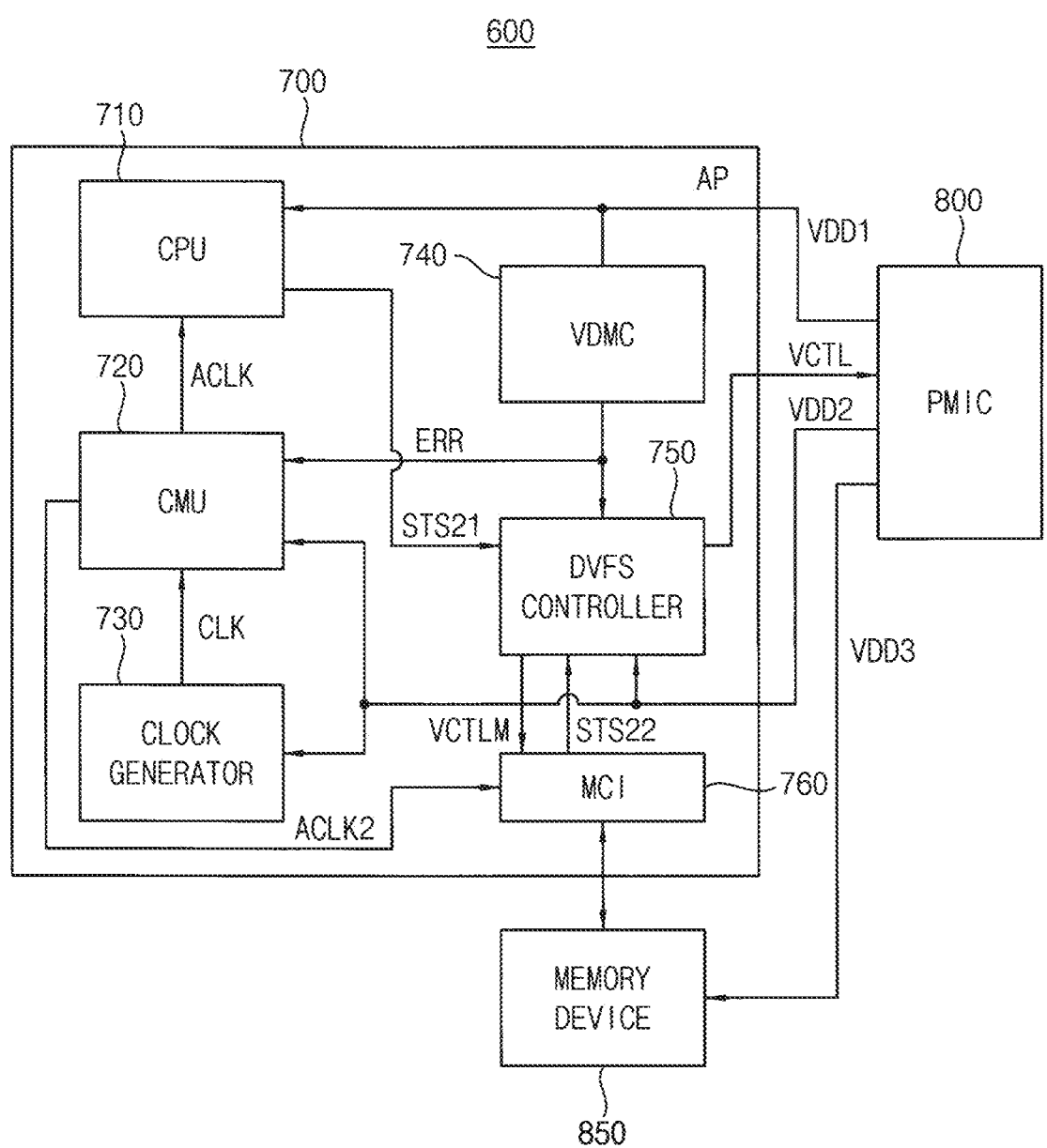
FIG. 16 is a circuit block diagram illustrating a data processing system including an SoC according to some example embodiments.

FIG. 16 is a circuit block diagram illustrating a data processing system including an SoC according to example embodiments.

Referring to FIG. 16, a data processing system 600 may include an application processor 700, a memory device 850 and a PMIC 800.

The data processing system 600 shown in FIG. 16 may be implemented on various computing systems. According to an embodiment, the data processing system 600 may be a mobile system including the application processor 700.

The data processing system 600 may include various types of memory devices 850. The memory device 850 may be a semiconductor device of various types in various embodiments. According to an embodiment, the memory device 850 may be a dynamic random access memory (DRAM), such as double data rate synchronous dynamic random access memory (DDR SDRAM), low power double data rate (LPDDR) SDRAM, graphics double data rate (GDDR) SDRAM, rambus dynamic random access memory (RDRAM), etc.

The application processor 700 may be implemented with an SoC according to example embodiments. The SoC may include a system bus (not shown) operating according to a protocol based on a predetermined standard bus specification and various intellectual property cores connected to the system bus. The standard specification of the system bus may be an advanced microcontroller bus architecture (AMBA) protocol of Advanced RISC Machine (ARM). The bus type of AMBA protocol includes Advanced High-performance Bus (AHB), Advanced Peripheral Bus (APB), Advanced eXtensible Interface (AXI), AXI4, AXI Coherency Extension (ACE), and the like. In addition, other types of protocols, such as uNetwork of SONICs Inc., CoreConnect of IBM, Open Core Protocol of OCP-IP, etc., may be used.

The application processor 700 may include a central processing unit (CPU) 710, a clock modulation circuit (CMU) 720, a clock generator 730, a voltage droop monitoring circuit 740, a DVFS controller 750 and a memory control interface (MCI) 760.

The CPU 710 may control function circuit blocks in the application processor 710. The CPU 710 may provide data access request to the memory device 850 via the memory control interface 760.

The memory control interface 760 may output a command to the memory device 850 according to a request from the CPU 710. The memory control interface 760 may write data in the memory device 850 or read data from the memory device 850 based on operation of the application processor 700. The memory control interface 760 may interface with the memory device 850 and may provide various commands to the memory device 850.

The PMIC 800 may provide a first power supply voltage VDD1 and a second power supply voltage VDD2 to the application processor 700 and may provide a third power supply voltage VDD3 to the memory device 850. The PMIC 800 may provide the first power supply voltage VDD1 to the CPU 710 and may provide the second power supply voltage VDD2 to the clock modulation circuit 720, the clock generator 730 and the DVFS controller 750.

The PMIC 800 may adjust a level of at least one of the first through third power supply voltages VDD1, VDD2 and VDD3 based on a voltage control signal VCTL from the DVFS controller 750.

The clock generator 730 may generate a clock signal CLK to provide the clock signal CLK to the clock modulation circuit 720.

The clock modulation circuit 720 may generate a first adaptive clock signal ACLK1 and a second adaptive clock signal ACLK2 based on the clock signal CLK, may provide the first adaptive clock signal ACLK1 to the CPU 710 and may provide the second adaptive clock signal ACLK2 to the memory control interface 760.

The voltage droop monitoring circuit 740 monitors a level of the first power supply voltage VDD1 provided to the CPU 710, and provides an error signal ERR to the clock modulation circuit 720 and the DVFS controller 750 if the droop occurs in the first power supply voltage VDD1. The voltage droop monitoring circuit 740 may employ the voltage droop monitoring circuit 200 of FIG. 2A and may include a controller, a ring oscillator circuit block, a counter and a droop detector.

The DVFS controller 750 provides the voltage control signal VCTL to the PMIC 800 based on the error signal ERR and the PMIC 800 may adjust the level of the first power supply voltage VDD1 based on the voltage control signal VCTL.

The DVFS controller 750 may receive a status signal STS21 from the CPU 710 and may receive a status signal STS22 from the memory control interface 760. The status signal STS21 may indicate operating speed of the CPU 710 and the signal STS22 may indicate operating speed of the memory device 850. The DVFS controller 750 may determine or estimate operating speed of the CPU 710 and the memory device 850 based on the status signals STS21 and STS22. The DVFS controller 750 may provide the PMIC 800 with the voltage control signal VCTL indicating the determined operating speed. The PMIC 800 may adjust a level of the first power supply voltage VDD1 and a level of the third power supply voltage VDD3 based on the voltage control signal VCTL.

The supplication processor 700 may provide a memory voltage control signal VCTLM to the memory device 850. In example embodiments, the DVFS controller 750 may generate the memory voltage control signal VCTLM and may provide the memory voltage control signal VCTLM to the memory device 850 through the memory control interface 760.

The DVFS controller 750 may receive status signal STS22 indicating operating status of the memory device 850 from the memory control interface 760 and may generate the memory voltage control signal VCTLM to adjust a level of operating voltage of the memory device 850 based on the memory voltage control signal VCTLM. The memory control interface 760 may check a workload on the memory device 850 and may determine whether to perform a high-speed memory operation or a low-speed memory operation according to a degree of the checked workload.

The memory device 850 may adjust the level of the third power supply voltage VDD3 in response to the memory voltage control signal VCTLM and may generate level-adjusted operating voltage as an internal voltage.

According to embodiment, the memory device 850 may previously adjust the level of the operation voltage before the operation speed is changed (or before the frequency of the second adaptive clock signal ACLK2 is changed).

In addition, the memory device 850 may set an adjustment time point of the level of the operation voltage in various ways in response to the change of the operation speed. For instance, in the case that the memory voltage control signal VCTLM is a signal requesting an increase of the level of the operation voltage, the memory device 850 may increase the level of the operation voltage before the operation speed actually increases, and thus the high-speed memory operation may be stably performed. In addition, in the case that the memory voltage control signal VCTLM is a signal requesting a decrease of the level of the operation voltage, the memory device 850 may decrease the level of the operation voltage at the time point at which the operation speed decreases (or at the time point at which the clock signal having the low frequency is received) without previously decreasing the level of the operation voltage, and thus the high-speed memory operation may be stably performed.

In FIG. 16, each of the application processor 700 and the PMIC 800 may be an SoC, respectively or the application processor 700 and the PMIC 800 may constitute an SoC. In addition, each of the CPU 710, the clock modulation circuit 720, the clock generator 730, the DVFS controller 750 and the memory control interface 760 may correspond to a functional circuit.

Figure 17:
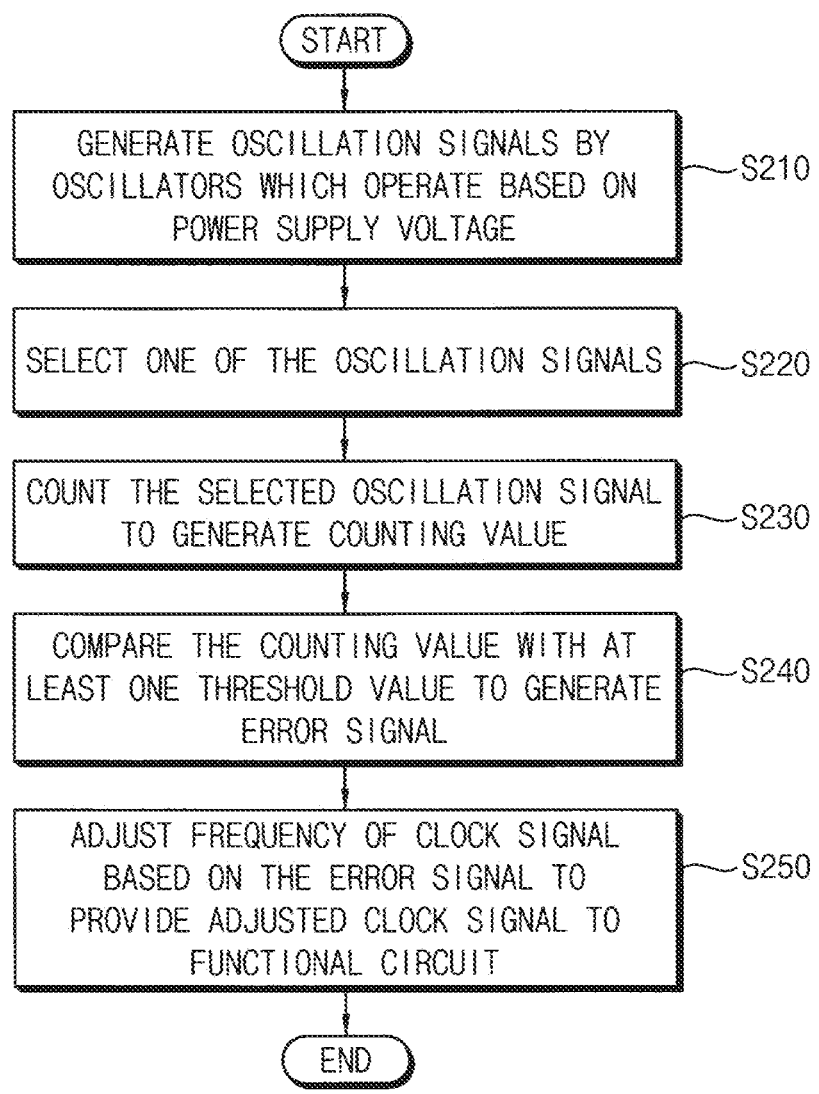
FIG. 17 is a flow chart illustrating a method of operating an SoC according to some example embodiments.

FIG. 17 is a flow chart illustrating a method of operating an SoC according to example embodiments.

Referring to FIGS. 1 through 17, there is provided a method of operating an SoC 10, The SoC 10 includes a functional circuit 110 operating based on a power supply voltage VDD and a voltage droop monitoring circuit 200 including a plurality of ring oscillators and monitoring the power supply voltage VDD. In the method, the plurality of ring oscillators 320a~320k generate a plurality of oscillation signals OS1~OSk robust to a change of temperature, based on the power supply voltage VDD (S210).

One of the oscillation signals OS1~OSk is selected and is provided as a selected oscillation signal OSS (S220).

The counter 230 in the voltage droop monitoring circuit 200 generates a counting value CV by counting a toggling of the selected oscillation signal OSS (S230).

The droop detector 250 in the voltage droop monitoring circuit 200 generates an error signal ERR by comparing the counting value CV with at least one threshold value (S240).

The clock modulation circuit 120 in the SoC 10 adjusts a frequency of a clock signal CLK based on the error signal ERR to provide an adaptive clock signal ACLK to the functional circuit 110 (S250). The clock modulation circuit 120 may decrease the frequency of a clock signal CLK to generate the adaptive clock signal ACLK if the error signal ERR indicates that a droop occurs in the power supply voltage VDD and may provide the adaptive clock signal ACLK to the functional circuit 110.

Figure 18:
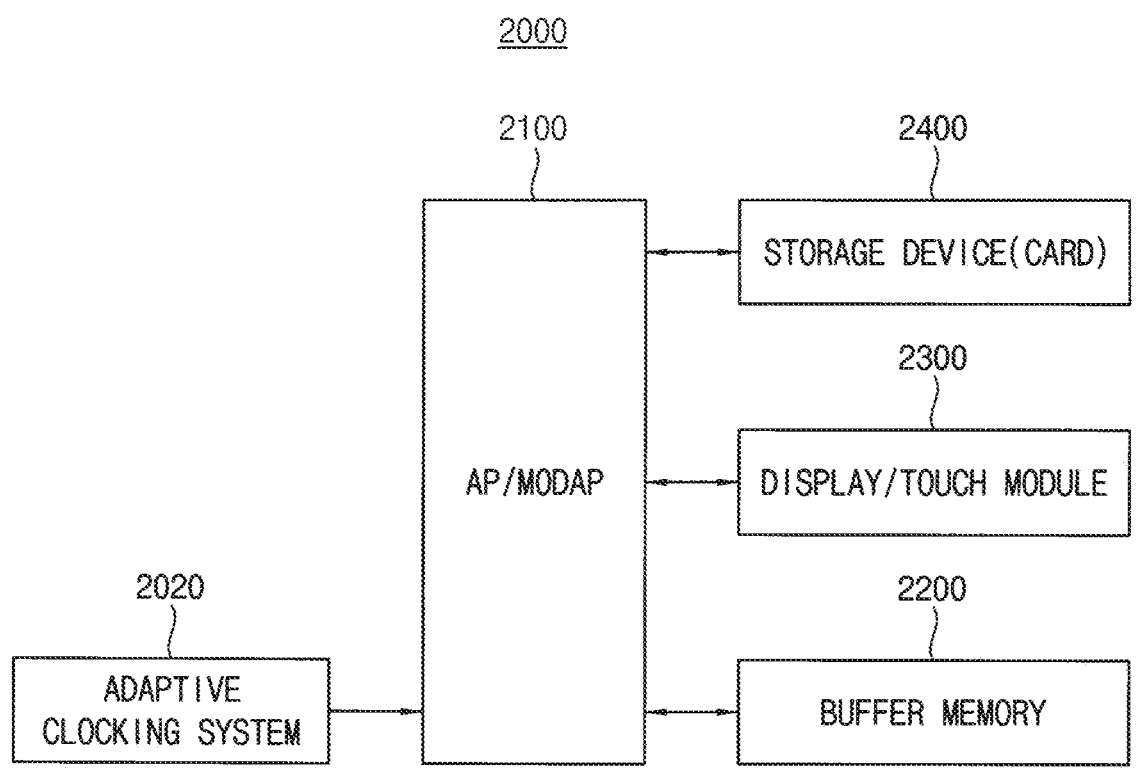
FIG. 18 is a circuit block diagram illustrating a mobile system including the SoC according to some example embodiments.

FIG. 18 is a circuit block diagram illustrating a mobile system including the SoC according to example embodiments.

Referring to FIG. 18, a mobile system 2000 may include an adaptive clocking system 2020, a processor (AP/ModAP) 2100, a buffer memory 2200, a display/touch module 2300, and a storage device 2400.

The adaptive clocking system 2020 may be implemented with the 10 of FIG. 1. The adaptive clocking system 2020 may detect voltage drop of at least one power line, may generate an adaptive clock signal based on the detected result and may provide the adaptive clock signal to the processor 2100.

Although not shown, the mobile system 2000 may further include a security chip. The security chip may be implemented to provide a security function. The security chip may include software and/or tamper resistant hardware, allow high-level security, and work in cooperation with a trusted execution environment (TEE) of the processor 2100.

The security chip may include a native operating system (OS), a security storage device that is an internal data storage, an access control circuit block to control an access authority to the security chip, a security function circuit block to perform ownership management, key management, digital signature, and encryption/decryption, and a firmware update circuit block to update firmware of the security chip. The security chip may be, for example, a universal IC card (UICC) such as USIM, CSIM, and ISIM, a subscriber identity module (SIM) card, embedded secure elements (eSE), MicroSD or Stickers.

The processor 2100 may be implemented to control the overall operation of the mobile system 2000 and wired/wireless communication with an external entity. For example, the processor 2100 may be, for example, an application processor (AP) or an integrated modem application processor (ModAP).

The buffer memory 2200 may be implemented to temporarily store data required for a processing operation of the mobile system 2000. The display/touch module 2300 may be implemented to display data processed by the processor 2100 or to receive data from a touch panel. The storage device 2400 may be implemented to store user's data. The storage device 2400 may be an embedded multimedia card (eMMC), a solid state drive (SSD) or a universal flash storage (UFS). The storage device 2400 may include at least one nonvolatile memory device.

A nonvolatile memory device may be a NAND flash memory, a vertical NAND (VNAND) flash memory, a NOR flash memory, a resistive random access memory (RRAM), a phase-change memory (PRAM), a magnetoresistive random access memory (MRAM), a ferroelectric random access memory (FRAM) or a spin transfer torque random access memory (STT-RAM).

The mobile system 2000 may enhance performance and may reduce power consumption by modulating a clock signal without regard to a frequency of the clock signal in the case when the voltage drops.

Aspects of the present inventive concept may be applied to various SoCs using a power supply voltage and a clock signal.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A voltage droop monitoring circuit, comprising:
a ring oscillator circuit block configured to generate a plurality of oscillation signals, configured to select an oscillation signal from the plurality of oscillation signals based on a first control signal, the first control signal based on a power supply voltage of a functional circuit block, and configured to output the selected oscillation signal;
a counter configured to receive the selected oscillation signal from the ring oscillator circuit block and count the selected oscillation signal to generate a count value; and
a droop detector configured to detect droop in the power supply voltage of the functional circuit block based on the count value and at least first and second threshold values, such that a greater level of droop is detected in response to the count value falling below the first threshold value than the second threshold value,
wherein the droop detector is configured to detect droop in the power supply voltage in response to the count value falling below the first threshold value, and
the droop detector is configured to detect an end of droop in the power supply voltage in response to the count value exceeding the second threshold value, the second threshold value being greater than the first threshold value.

2. The circuit of claim 1, wherein
the ring oscillator circuit block includes a plurality of ring oscillators each generating a respective one of the plurality of oscillation signals, and the ring oscillator circuit block is configured to selectively set an intrinsic speed of one or more of the plurality of ring oscillators based on the first control signal.

3. The circuit of claim 1, wherein
the ring oscillator circuit block includes a plurality of ring oscillators each generating a respective one of the plurality of oscillation signals based on the power supply voltage.

4. The circuit of claim 1, further comprising:
a controller configured to set the first and second threshold values based on a reference voltage associated with the power supply voltage of the functional circuit block.

5. The circuit of claim 1, further comprising:
a controller configured to set the first threshold value based on a reference voltage associated with the power supply voltage of the functional circuit block.

6. The circuit of claim 1, wherein
the droop detector is configured to detect a level of droop in the power supply voltage based on the count value and a plurality of first threshold values.

7. The circuit of claim 6, wherein
the plurality of first threshold values decrease in value, and are associated with a different level of droop in the power supply voltage; and
the droop detector is configured to detect droop in response to the count value falling below one of the plurality of first threshold values, and is configured to detect the level of droop based on a lowest one of the plurality of first threshold values the count value falls below.

8. The circuit of claim 6, wherein
the droop detector is configured to detect a level of droop in the power supply voltage based on the count value, a plurality of first threshold values, and a plurality of second threshold values, each second threshold value of the plurality of second threshold values associated with a respective first threshold value of the plurality of first threshold values, and each second threshold value of the plurality of second threshold values being greater than the respective first threshold value; and
the plurality of first threshold values decrease in value, and are associated with a different level of droop in the power supply voltage; and
the droop detector is configured to detect droop in response to the count value falling below one of the plurality of first threshold values, is configured to detect the level of droop based on a lowest one of the plurality of first threshold values the count value falls below, and is configured to detect a reduced level of droop in response to the count value rising above the second threshold value associated with the lowest one of the plurality of first threshold values the count value falls below.

9. The circuit of claim 8, further comprising:
a controller configured to set the plurality of first threshold values and the plurality of second threshold values based on a reference voltage associated with the power supply voltage of the functional circuit block.

10. The circuit of claim 6, further comprising:
a controller configured to set the plurality of first threshold values based on a reference voltage associated with the power supply voltage of the functional circuit block.

11. The circuit of claim 1, further comprising:
a controller configured to set the at least one threshold value based on a reference voltage associated with the power supply voltage of the functional circuit block.

12. The circuit of claim 1, further comprising:
a controller configured to generate the first control signal based on the power supply voltage of the functional circuit block.

13. A system-on chip, comprising:
a voltage droop monitoring circuit configured to monitor droop in a power supply voltage of a functional circuit block, and generate an error signal based on the monitoring; and
a clock modulation circuit configured to modulate an input clock signal based on the error signal to generate an adaptive clock signal, and configured to output the adaptive clock signal to the functional circuit block,
wherein the clock modulation circuit is configured such that, in response to the error signal indicating an end of droop in the power supply voltage, the clock modulation circuit incrementally increases a frequency of the adaptive clock signal until the frequency of the adaptive clock signal reaches a pre-droop frequency, the pre-droop frequency being a frequency of the input clock signal prior to the modulation of the input clock signal, the incremental increasing of the frequency of the adaptive clock signal including periodically increasing the frequency of the adaptive clock signal such that the frequency of the adaptive clock signal is increased a plurality of times before reaching the pre-droop frequency,
wherein the voltage droop monitoring circuit is configured to
activate the error signal in response to a count value falling below a first threshold value, and
deactivate the error signal in response to the count value rising above a second threshold value,
the second threshold value being greater than the first threshold value.

14. The system-on chip of claim 13, wherein
the clock modulation circuit is configured to reduce the frequency of the adaptive clock signal below the pre-droop frequency in response to the error signal indicating droop in the power supply voltage.

15. The system-on chip of claim 13, wherein
the voltage droop monitoring circuit is configured to generate the error signal such that the error signal indicates a level of droop; and
the clock modulation circuit is configured to change a frequency of the adaptive clock based on the level of droop.

16. The system-on chip of claim 15, wherein
the clock modulation circuit is configured to decrease the frequency of the adaptive clock signal as the level of droop increases, and is configured to increase the frequency of the adaptive clock signal as the level of droop decreases.

17. The circuit of claim 1, further comprising:
a look-up table configured to output the first control signal based on the power supply voltage.

* * * * *